United States Patent
Park et al.

(10) Patent No.: US 11,101,278 B2
(45) Date of Patent: Aug. 24, 2021

(54) SEMICONDUCTOR MEMORY DEVICE AND SEMICONDUCTOR DEVICE

(71) Applicants: Jong-kook Park, Seoul (KR); Hong-soo Kim, Seongnam-si (KR); Tae-keun Cho, Seoul (KR)

(72) Inventors: Jong-kook Park, Seoul (KR); Hong-soo Kim, Seongnam-si (KR); Tae-keun Cho, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 40 days.

(21) Appl. No.: 15/490,154

(22) Filed: Apr. 18, 2017

(65) Prior Publication Data

US 2017/0301684 A1    Oct. 19, 2017

(30) Foreign Application Priority Data

Apr. 18, 2016    (KR) .................. 10-2016-0046972

(51) Int. Cl.

| | |
|---|---|
| H01L 27/115 | (2017.01) |
| H01L 27/11556 | (2017.01) |
| H01L 27/11521 | (2017.01) |
| H01L 27/11526 | (2017.01) |
| H01L 27/11568 | (2017.01) |

(Continued)

(52) U.S. Cl.
CPC .. *H01L 27/11556* (2013.01); *H01L 27/11521* (2013.01); *H01L 27/11526* (2013.01);
(Continued)

(58) Field of Classification Search
CPC ....... H01L 21/115521; H01L 21/11526; H01L 21/11556; H01L 21/11568;
(Continued)

(56) References Cited

U.S. PATENT DOCUMENTS

| | | | |
|---|---|---|---|
| 6,759,282 B2 | 7/2004 | Campbell et al. | |
| 7,969,789 B2 | 6/2011 | Katsumata et al. | |

(Continued)

FOREIGN PATENT DOCUMENTS

| | | |
|---|---|---|
| CN | 104425512 A | 3/2015 |
| CN | 105321924 A | 2/2016 |
| CN | 105448928 A | 3/2016 |

OTHER PUBLICATIONS

Chinese Office Action dated May 20, 2021 issued in corresponding Chinese Patent Application No. 201710253929.9.

*Primary Examiner* — Ori Nadav
(74) *Attorney, Agent, or Firm* — Harness, Dickey & Pierce, P.L.C.

(57) ABSTRACT

A semiconductor memory device includes: a substrate including a cell region and a connection region; a first word line stack comprising a plurality of first word lines that extend to the connection region and are stacked on the cell region; a second word line stack comprising a plurality of second word lines that extend to the connection region and are stacked on the cell region, the second word line being adjacent to the first word line stack; vertical channels in the cell region of the substrate, the vertical channels being connected to the substrate and coupled with the plurality of first and second word lines; a bridge region that connects the first word lines of the first word line stack with the second word lines of the second word line stack; and a local planarized region under the bridge region.

19 Claims, 28 Drawing Sheets

(51) Int. Cl.
*H01L 27/11573* (2017.01)
*H01L 27/11582* (2017.01)

(52) U.S. Cl.
CPC .. *H01L 27/11568* (2013.01); *H01L 27/11573* (2013.01); *H01L 27/11582* (2013.01)

(58) Field of Classification Search
CPC ......... H01L 21/11573; H01L 21/11582; H01L 27/11556; H01L 27/11521; H01L 27/11526; H01L 27/11568; H01L 27/11573; H01L 27/11582
USPC .............................. 257/314–320, 326, 334
See application file for complete search history.

(56) References Cited

U.S. PATENT DOCUMENTS

| | | |
|---|---|---|
| 8,198,670 B2 | 6/2012 | Aoyama |
| 8,203,882 B2 | 6/2012 | Hishida et al. |
| 8,268,687 B2 | 9/2012 | Hyun et al. |
| 8,508,999 B2 | 8/2013 | Liu et al. |
| 8,659,947 B2 | 2/2014 | Iwai et al. |
| 8,946,023 B2 | 2/2015 | Makala et al. |
| 9,093,370 B2 | 7/2015 | Hwang |
| 2010/0276739 A1 | 11/2010 | Choi |
| 2014/0197481 A1 | 7/2014 | Hwang et al. |
| 2015/0137216 A1 | 5/2015 | Lee et al. |
| 2015/0287479 A1* | 10/2015 | Nam .................... G11C 29/025 714/721 |
| 2016/0056210 A1* | 2/2016 | Takaki .............. H01L 21/32139 257/5 |
| 2016/0086953 A1 | 3/2016 | Liu |
| 2016/0093382 A1 | 3/2016 | Sakamoto et al. |

\* cited by examiner

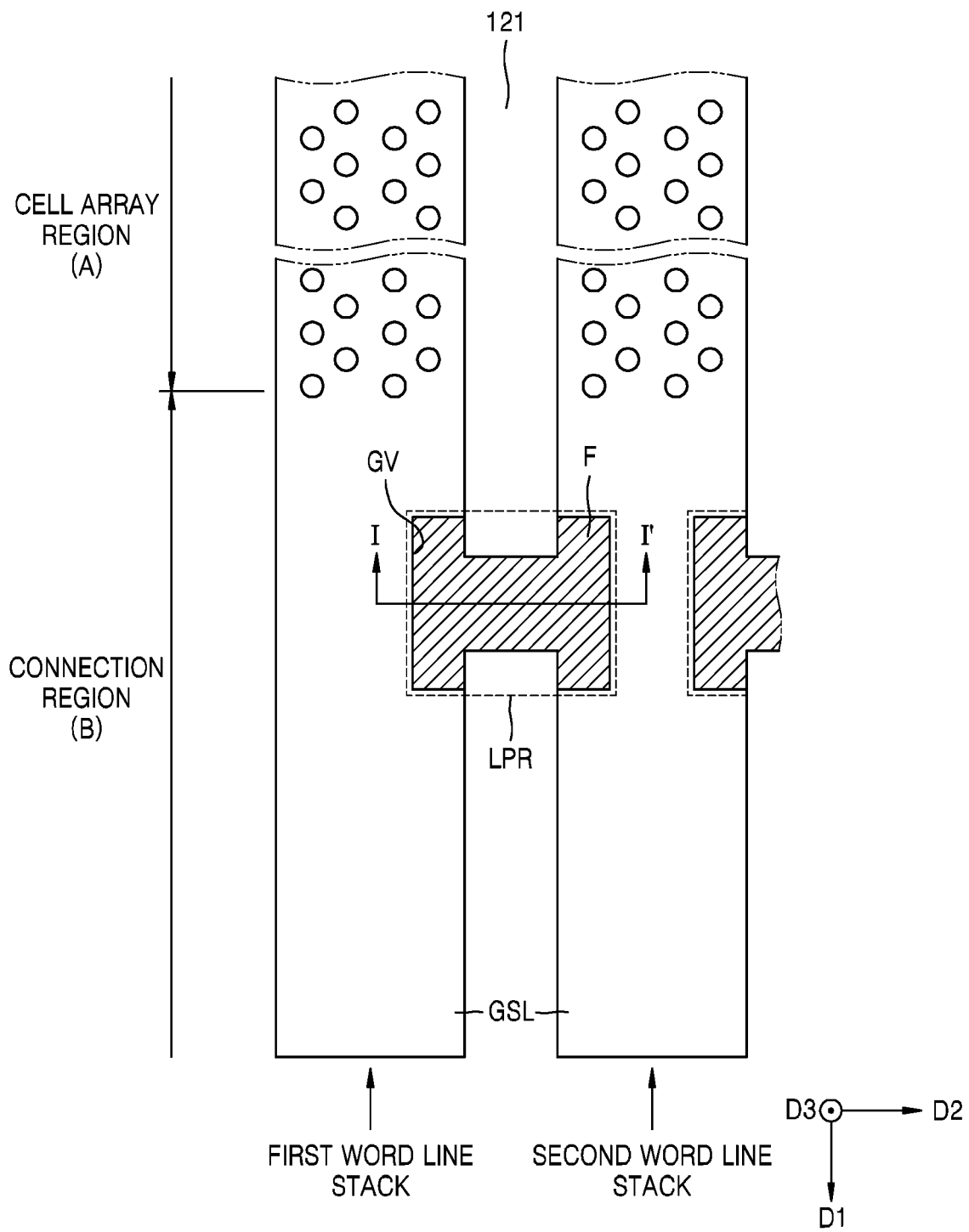

(CONVENTIONAL BRIDGE REGION)

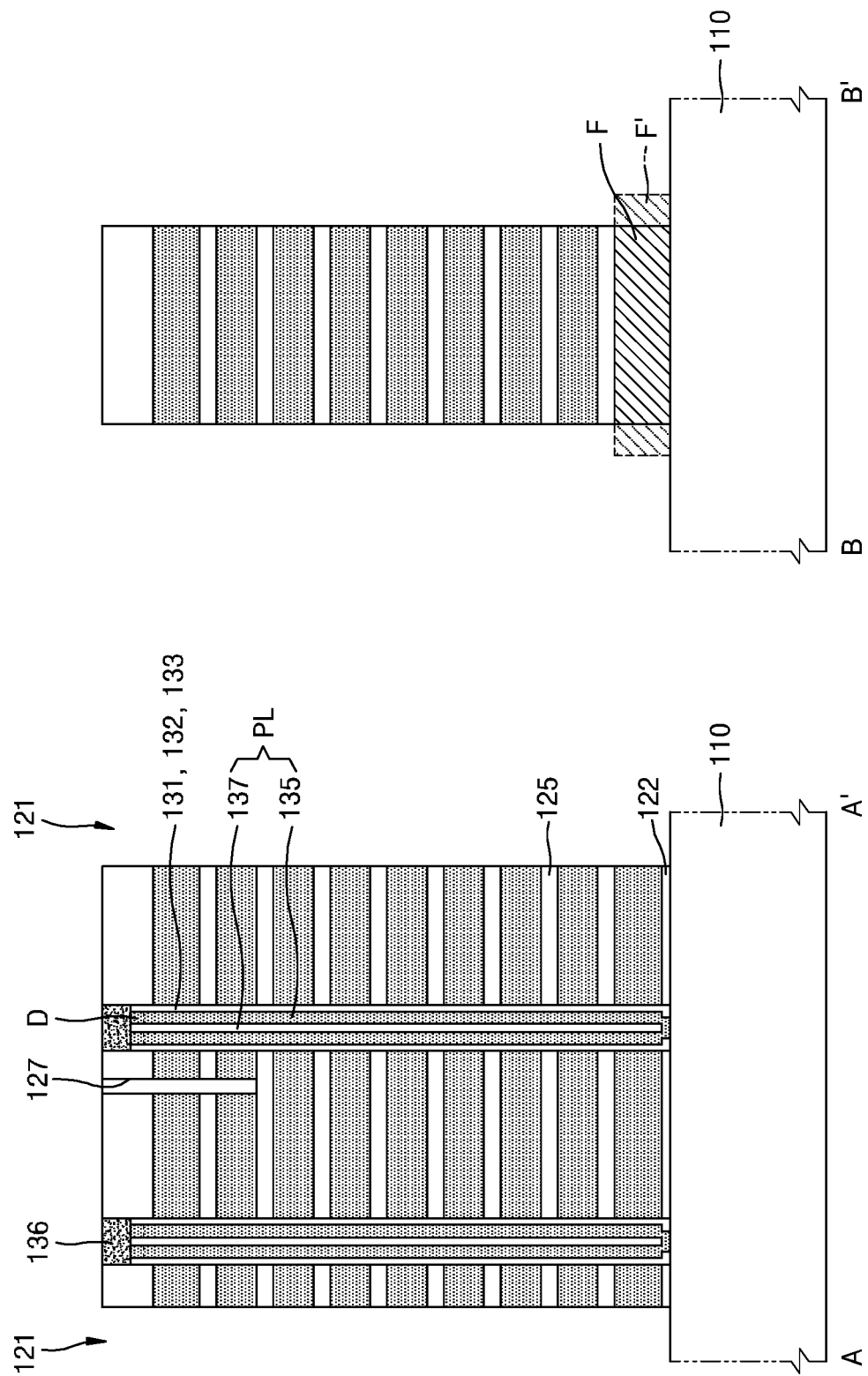

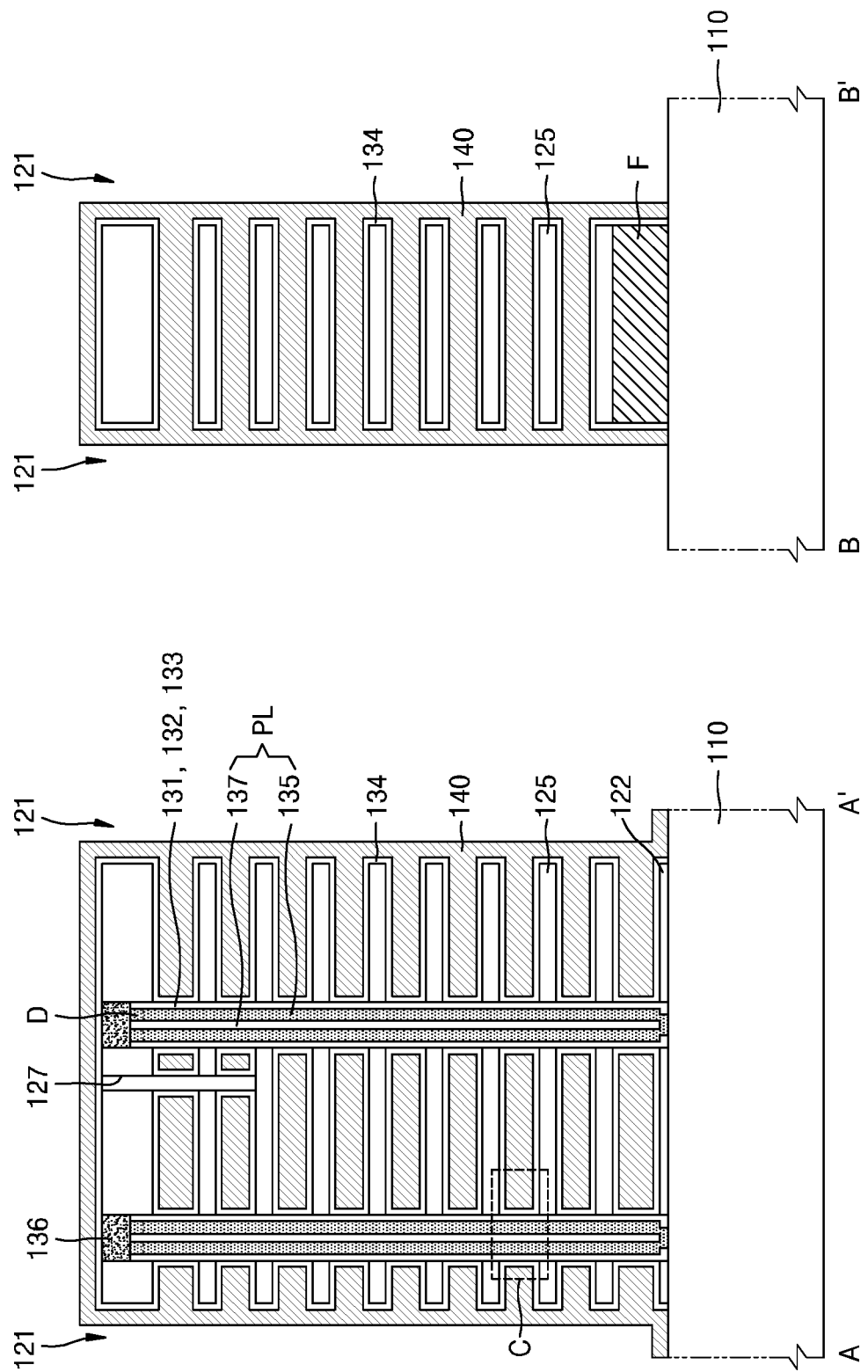

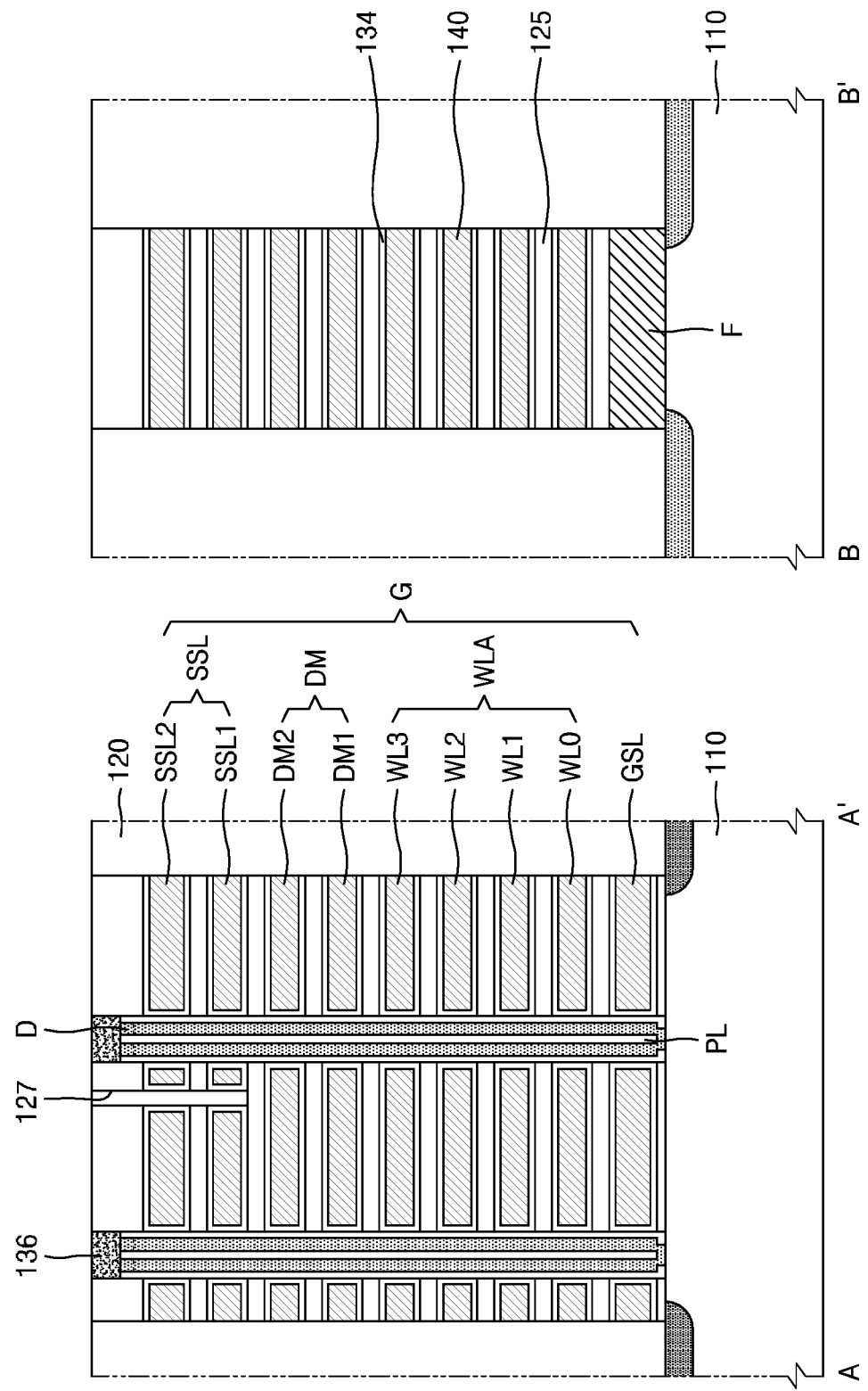

SEMICONDUCTOR MEMORY DEVICE AND SEMICONDUCTOR DEVICE

CROSS-REFERENCE TO RELATED APPLICATION

This application claims the benefit of Korean Patent Application No. 10-2016-0046972, filed on Apr. 18, 2016, in the Korean Intellectual Property Office, the disclosure of which is incorporated herein in its entirety by reference.

BACKGROUND

Aspects of the inventive concept relate to semiconductor memory devices and semiconductor devices, and more particularly, to a semiconductor memory device and a semiconductor device that may maintain a high operation speed with high reliability and may be manufactured at low cost.

For high integration of semiconductor devices, there have been suggested vertical semiconductor devices including a vertical array of memory cells arranged in three dimensions. Various methods of increasing the operation speed of semiconductor devices have been suggested recently. However, such methods may mostly reduce reliability or durability of the semiconductor device or require costly processes. Therefore, there is a high demand for a method of manufacturing a semiconductor device that has a high operation speed and improved reliability at reduced cost.

SUMMARY

Aspects of the inventive concepts provide a semiconductor memory device that may maintain a high operation speed, high reliability, and may be manufactured at reduced cost.

Aspects of the inventive concepts provide a semiconductor device that may maintain a high operation speed, high reliability, and may be manufactured at less cost.

According to an aspect of the inventive concepts, there is provided a semiconductor memory device including: a substrate including a cell region and a connection region; a first word line stack comprising a plurality of first word lines that extend to the connection region and are; a second word line stack comprising a plurality of second word lines that extend to the connection region and are stacked on the cell region, the second word line being adjacent to the first word line stack; vertical channels in the cell region of the substrate, the vertical channels being connected to the substrate and coupled with the plurality of first and second word lines; a bridge region that connects the first word lines of the first word line stack with the corresponding second word lines of the second word line stack; and a local planarized region under the bridge region.

According to another aspect of the inventive concepts, there is provided a semiconductor device including: a first horizontal electrode that extends on a semiconductor substrate in a first direction; a second horizontal electrode that extends on the same level as the first horizontal electrode in the first direction; a filler that at least partially fills a local planarized region between the first horizontal electrode and the second horizontal electrode; and a stack of conductors and insulators on the filler.

BRIEF DESCRIPTION OF THE DRAWINGS

Embodiments of the inventive concepts will be more clearly understood from the following detailed description taken in conjunction with the accompanying drawings in which:

FIG. 6 is a plan view illustrating that portions of ground selection lines that correspond to a bridge are removed, according to an example embodiment;

FIGS. 10A to 10I are side sectional views illustrating a method of manufacturing a semiconductor memory device in order, according to an example embodiment;

DETAILED DESCRIPTION OF THE EMBODIMENTS

Figure 1:
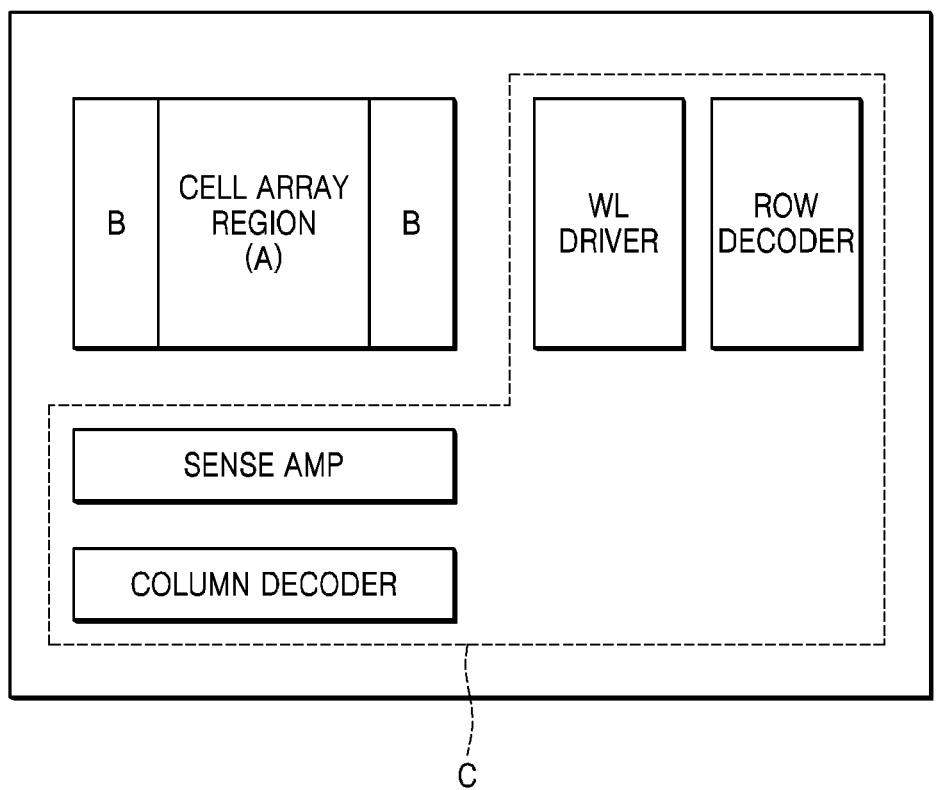
FIG. 1 is a schematic block diagram of a 3-dimensional (3D) semiconductor memory device according to an example embodiment.

FIG. 1 is a schematic block diagram of a 3-dimensional (3D) semiconductor memory device according to an example embodiment. Referring to FIG. 1, a 3D semiconductor memory device according to an example embodiment may include a cell array region A, a connection region B, and a peripheral circuit region C.

In the cell array region A, memory cells arranged in 3-dimension, and bit lines and word lines which may be electrically connected with the memory cells may be formed. In the connection region B, which may be between the cell array region A and the peripheral circuit region C, contact plugs and wirings that may connect the memory cells and peripheral circuits may be formed. In the peripheral circuit region C, peripheral circuits for driving the memory cells and reading data stored in the memory cells may be formed. In particular, in the peripheral circuit region C, a word line (WL) driver, a sense amplifier, a row decoder, a column decoder, and control circuits may be formed.

Figure 2:
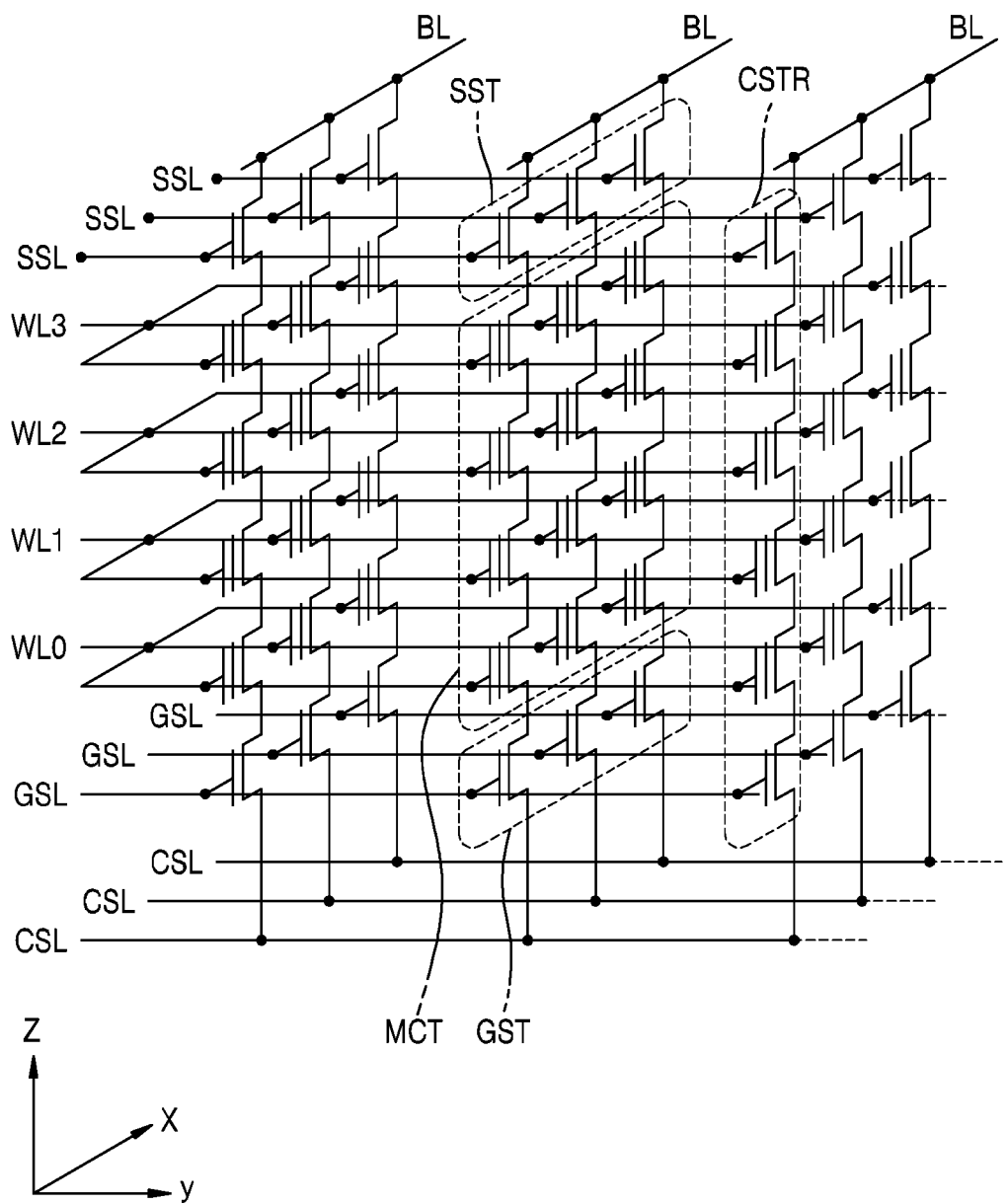
FIG. 2 is a schematic circuit diagram of a cell array of a 3D semiconductor memory device according to an example embodiment.
Figure 3:
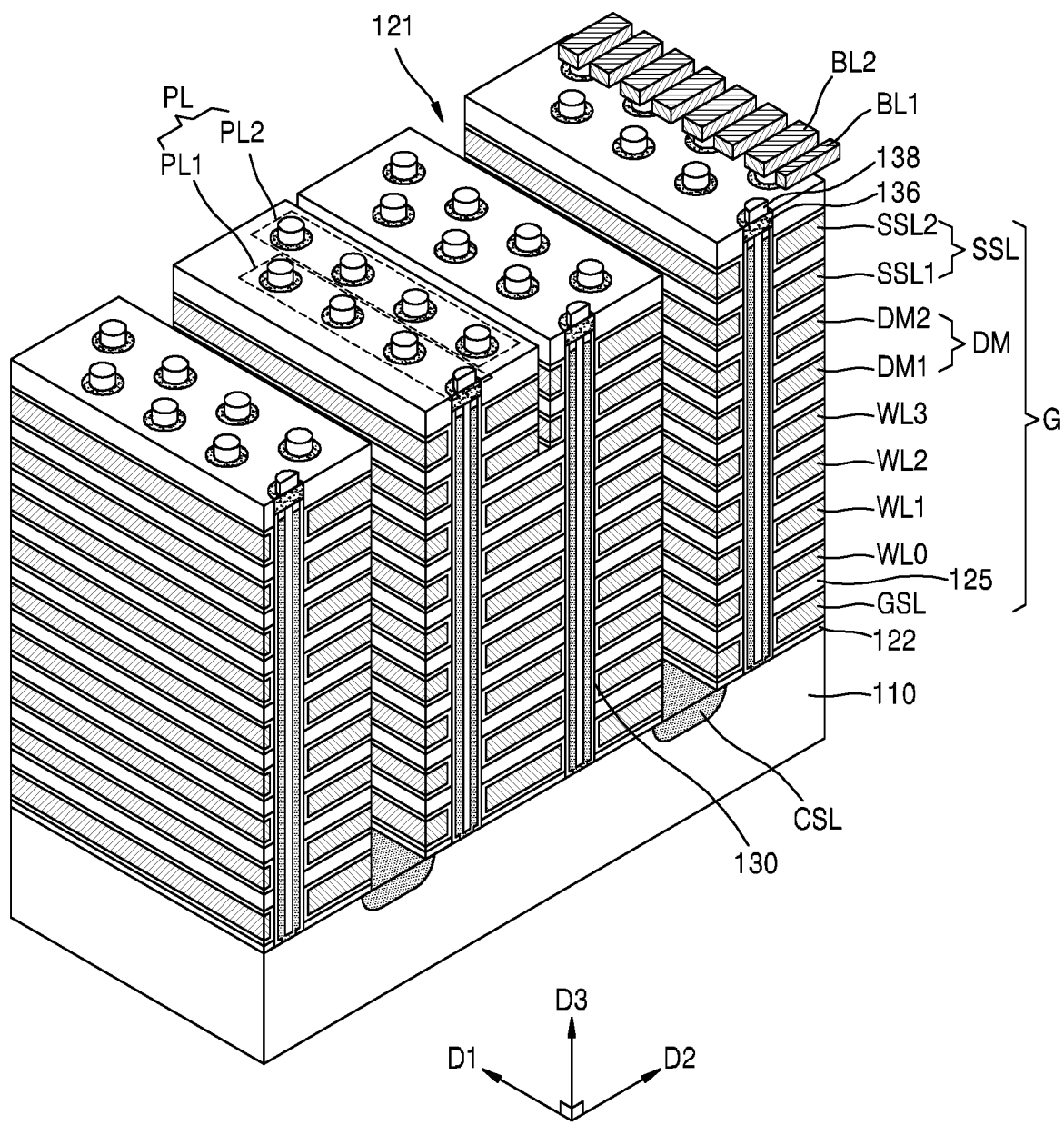
FIG. 3 is a perspective view of a cell array of the 3D semiconductor memory device according to an example embodiment.

FIG. 2 is a schematic circuit diagram of a cell array in a 3D semiconductor memory device according to an example embodiment. FIG. 3 is a perspective view of a cell array of the 3D semiconductor memory device according to an example embodiment.

Referring to FIG. 2, a cell array of a 3D semiconductor memory device according to an example embodiment may include a plurality of common source lines CSL, a plurality of bit lines BL, and a plurality of cell strings CSTR between the common source lines CSL and the plurality of bit lines BL.

The plurality of bit lines BL may be arranged in two dimensions and may be connected in parallel to the plurality of cell strings CSTR. The plurality of cell strings CSTR may be connected in common to a corresponding common source line CSL. That is, the plurality of cell strings CSTR may be between the plurality of bit lines BL and one common source line CSL. The plurality of common source lines CSL may be arranged in two dimensions. The same voltage may be electrically applied to the plurality of common source lines CSL. In some embodiments, the plurality of common source lines CSL may be each independently electrically controlled.

Each of the plurality of cell strings CSTR may include a ground selection transistor GST connected to a common source line CSL, a string selection transistor SST connected to a bit line BL, and a plurality of memory cell transistors MCT between the ground selection transistor GST and the string selection transistor SST. The ground selection transistor GST, the string selection transistor SST, and the memory cell transistors MCT may be connected in series to one another.

The common source line CSL may be connected in common to sources of the ground selection transistors GST. Ground selection lines GSL, a plurality of word lines WL0-WL3, and a plurality of string selection lines SSL, which are between the common source lines CSL and the bit lines BL, may be used as gate electrodes of the ground selection transistors GST, the memory cell transistors MCT, and the string selection transistors SST, respectively. The memory cell transistors MCT may each include a data storage element.

Referring to FIG. 3, a substrate 110 may be provided. The substrate 110 may be of a first conductive type, for example, of a P type. A buffer dielectric film 122 may be provided on the substrate 110. The buffer dielectric film 122 may be a silicon oxide film such as a middle temperature oxide (MTO) film. Insulating patterns 125 and horizontal electrodes isolated from each other by the insulating patterns 125 may be provided on the buffer dielectric film 122.

The horizontal electrodes may include a ground selection line GSL, first to fourth word lines WL0-WL3, and string selection lines SSL. The insulating patterns 125 may be silicon oxide films. The thickness of the buffer dielectric film 122 may be less than the thickness of each insulating pattern 125. The horizontal electrodes may include doped silicon, metal (for example, tungsten), metal nitride (for example, titanium nitride), metal silicide, or a combination thereof. For example, each of the horizontal electrodes may include a barrier layer and a metal layer on the barrier layer. The barrier layer may include metal nitride, for example, titanium nitride. The metal layer may include, for example, tungsten.

The insulating patterns 125 and the horizontal electrodes may constitute a gate structure G. The gate structure G may horizontally extend in a first direction D1. A plurality of gate structures G may be provided on the substrate 110. The gate structures G may face one another in a second direction D2 that intersects the first direction D1. The string selection lines SSL may be separated from one another in the second direction D2 and may extend in the first direction D1. Although a gate structure G in FIG. 3 is illustrated as including a plurality of string selection lines SSL1 and SSL2 and one ground selection line GSL, embodiments of the present disclosure are not limited thereto.

An isolation region 121 that extends in the first direction D1 may be provided between two adjacent gate structures G. Common source lines CSL may be provided in the isolation regions 121 in the substrate 110. The common source lines CSL that may be separated from one another and may extend in the substrate in the first direction D1. The common source lines CSL may be of a second conductive type, for example, an N type, different from the first conductive type. Unlike FIG. 3, the common source lines CSL may be provided between two adjacent ground selection lines GSL on the substrate 110, and may be a line pattern extending in the first direction D1.

A plurality of cell columns PL may be connected to the substrate 110 through the horizontal electrodes. The cell columns PL may have a major axis that may vertically extend upwards from the substrate 110 (i.e., in a third direction D3). An end of each of the cell columns PL may be connected to the substrate 110, and the opposite end thereof may be connected to wirings that extend in the second direction D2. The wirings may include a first wiring BL1 and a second wiring BL2, which may be adjacent to one another and extend in the second direction D2.

A plurality of cell columns PL connected to one string selection line SSL may be in a zig-zag or staggered fashion. The plurality of cell columns PL may include first cell columns PL1 and second cell columns PL2 that may be connected to one string selection line SSL. The first cell columns PL1 may be most adjacent to the isolation region 121, whereas the second cell columns PL2 may be relatively more away from the isolation region 121. The second cell columns PL2 may be shifted from the first cell columns PL1 in the first direction D1 and the second direction D2. The first cell columns PL1 and the second cell columns PL2 may be connected to a first upper wiring BL1 and a second upper wiring BL2, respectively, via conductive patterns 136 and contacts 138.

A plurality of cell strings CSTR may be provided between the first and second upper wirings BL1 and BL2 and the common source lines CSL. The first and second upper wirings BL1 and BL2 may be bit lines of a flash memory device. Each cell string may include a string selection transistor connected to the first and second upper wirings BL1 and BL2, a ground selection transistor connected to the common source lines CSL, and a plurality of vertical string memory cells between the string selection transistor and the ground selection transistor. The ground selection line GSL may correspond to a ground selection gate of the ground selection transistor, the word lines WL0-WL3 may correspond to cell gates of the plurality of vertical string memory cells, and the string selection line SSL may correspond to a string selection gate of the string selection transistor. Each cell column PL may include a plurality of vertical string memory cells MC. The ground selection gate may be a ground selection gate of a flash memory device. The string selection gate may be a string selection gate of a flash memory device.

A data storage element 130 may be provided between the word lines WL0-WL3 and the cell columns PL. The data storage element 130 may be a charge storage layer. For example, the data storage element 130 may be one of a trap insulating layer, a floating gate electrode, and an insulating layer including conductive nanodots. As illustrated in FIG. 3, the data storage element 130 may extend between the insulating patterns 125 and the word lines WL0-WL3. In some other embodiments, at least part of the data storage element 130 may extend between the insulating patterns 125 and the cell columns PL. A gate insulating layer, instead of the data storage element 130, may be provided between the string selection lines SSL and ground selection lines GSL, and the cell columns PL.

A dielectric layer used as a gate insulating layer of a transistor may be between the ground selection lines GSL and the cell columns PL, or between the string selection lines SSL1 and SSL2 and the cell columns PL. The dielectric layer may be formed of the same material as the data storage element 130. The dielectric layer may be a gate insulating layer for a general metal oxide semiconductor field-effect transistor (MOSFET), for example, may be a silicon oxide layer.

In this structure, the cell columns PL may constitute a MOSFET together with the ground selection lines GSL, the word lines WL0-WL3, and the string selection lines SSL1 and SSL2, wherein the cell columns PL may serve as channel regions of the MOSFET. In some other embodiments, the cell columns PL may constitute a metal oxide silicon (MOS) capacitor together with the ground selection lines GSL, the word lines WL0-WL3, and the string selection lines SSL1 and SSL2.

The ground selection lines GSL and the string selection lines SSL1 and SSL2 may be used as gate electrodes of selection transistors, and the word lines WL0-WL3 may be used as gate electrodes of cell transistors. A fringe field generated by a voltage applied to the ground selection lines GSL, the word lines WL0-WL3, and the string selection lines SSL1 and SSL2 may form inversion regions in the cell columns PL. A maximum length (or width) of the inversion regions may be greater than a thickness of the word lines WL0-WL3 or selection lines SSL, SSL2, and GSL that form the inversion regions. Accordingly, the inversion regions formed in the cell columns PL may vertically overlap with one another to form a current path through which a selected bit line is electrically connected with the common source line CSL. The cell strings CSTR may have a structure in which the ground selection transistors and the string selection transistors in the ground selection lines GSL and the string selection lines SSL1, respectively, are connected in series with the memory cell transistors (MCT, see FIG. 2) including the word lines WL0-WL3.

In some embodiments, dummy word lines DM1 and DM2 may be between the string selection lines SSL1 and SSL2 and the word lines WL0-WL3. The dummy word lines DM1 and DM2 may maintain distribution of threshold voltages in the string selection lines SSL1 and SSL2 uniform to prevent reduction in cell current.

Figure 4A:
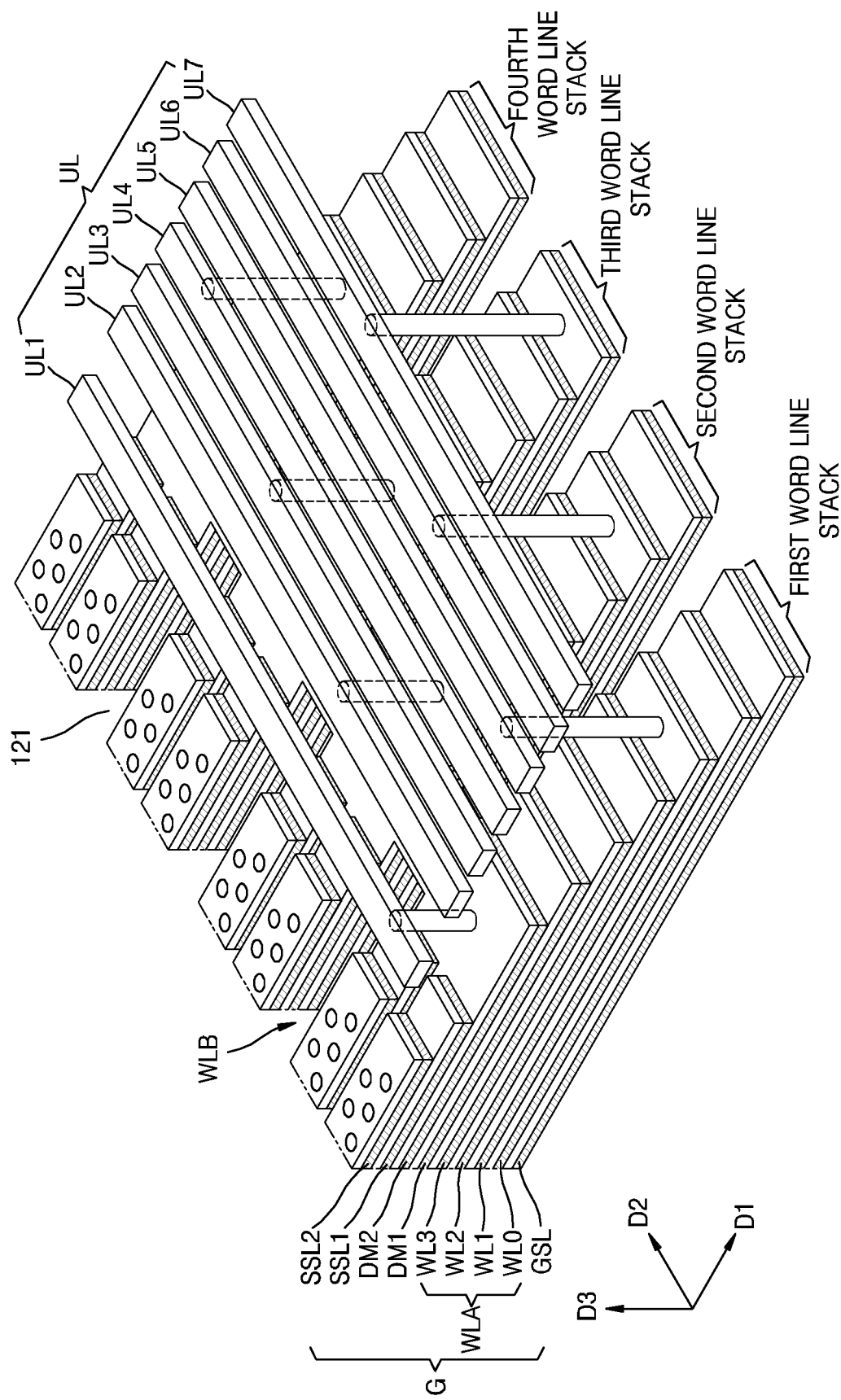
FIG. 4A is a partial perspective view of a connection region of a vertical semiconductor memory device according to an example embodiment.
Figure 4B:
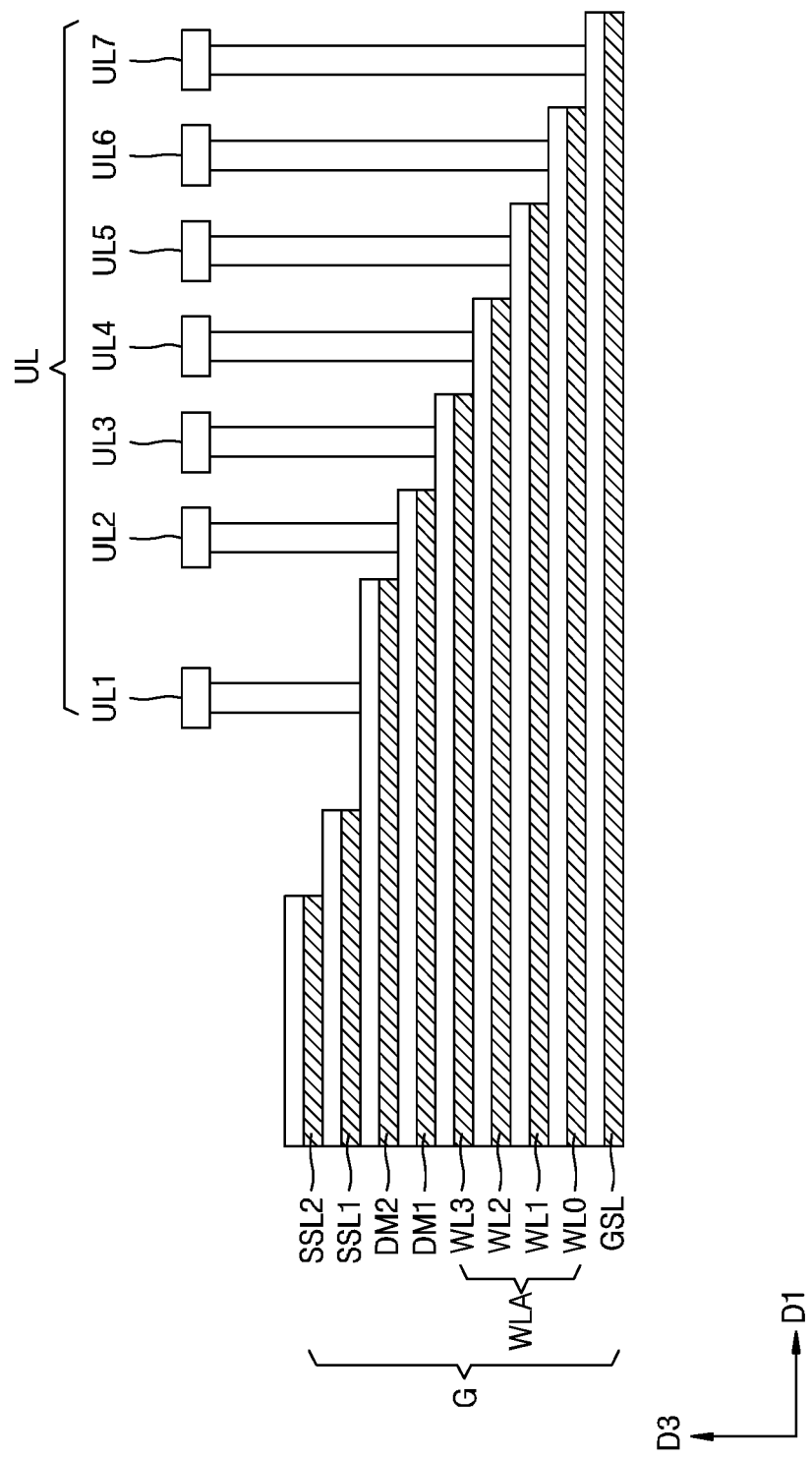
FIG. 4B is a vertical cross-sectional view of the vertical semiconductor memory device of FIG. 4A in a second direction D2.
Figure 5:
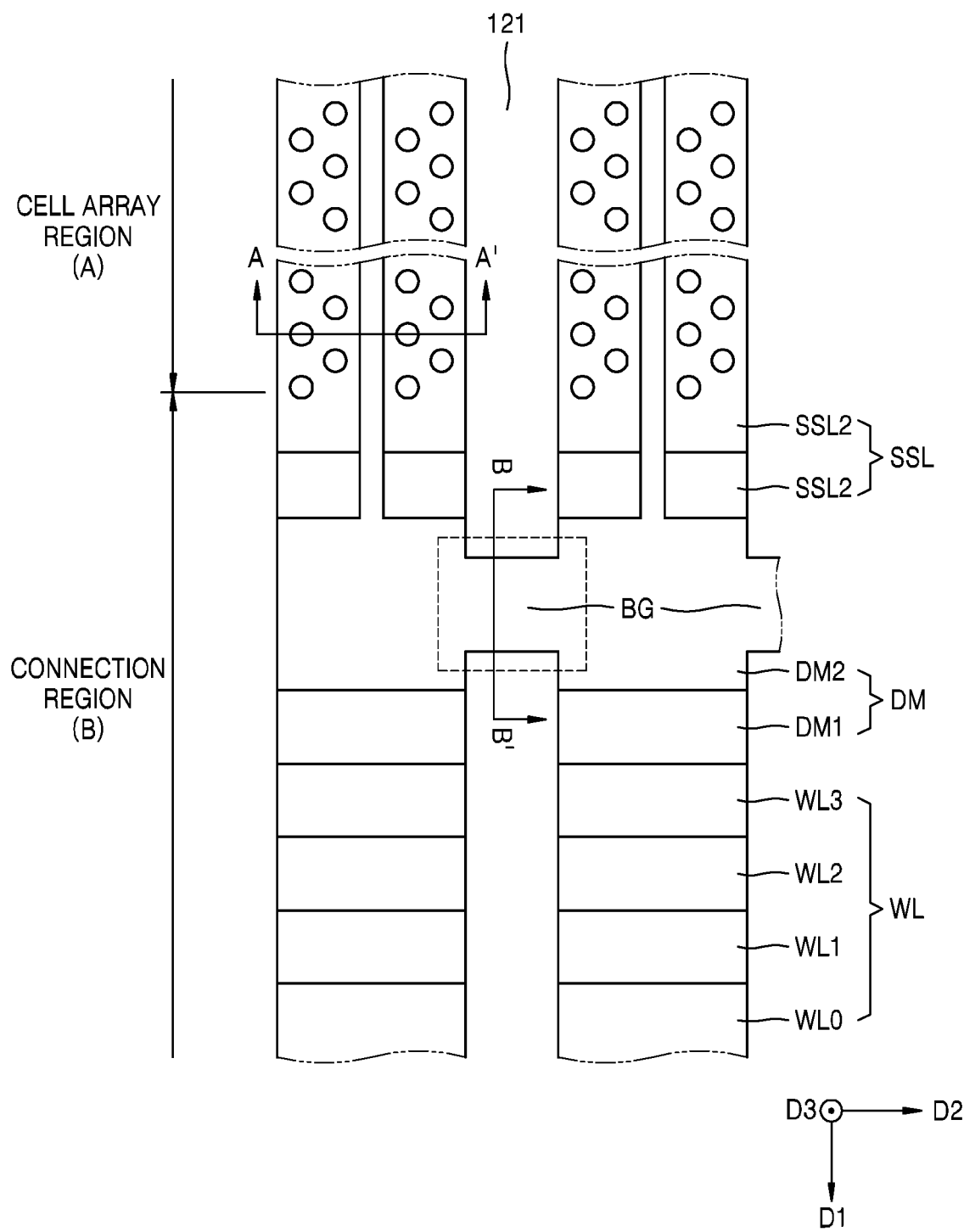
FIG. 5 is a partial plan view of a connection region of the vertical semiconductor memory device of FIG. 4A.

FIG. 4A is a partial perspective view of a connection region of a vertical semiconductor memory device according to an example embodiment. FIG. 4B is a side cross-sectional view of the vertical semiconductor memory device of FIG. 4A in a second direction D2. FIG. 5 is a partial plan view of a connection region of the vertical semiconductor memory device of FIG. 4A.

Referring to FIGS. 4A, 4B, and 5, a cell array region A and a connection region B may be adjacent to each other. The arrangement of the connection region B, including contact plugs and wirings that may connect memory cells and peripheral circuits, adjacent to the cell array region A, may be the same as described above with reference to FIG. 1.

In the connection region B, gate structures G may have a stepwise structure for electrical connection with a peripheral circuit region. In the stepwise structure, the gate structures G may extend in a first direction D1 in a stepwise fashion where the string selection lines SSL2 and SSL1, the dummy word lines DM2 and DM1, the word lines WL3-WL0, and the ground selection line GSL may extend gradually longer in the stated order and laterally protrude corresponding upper horizontal electrodes.

The semiconductor memory device of FIG. 4A may include at least a first word line stack and a second word line stack. The first word line stack may include first word lines WLA stacked on one another in the cell array region A. The second word line stack may include second word lines WLB stacked on one another in the cell array region A. As described above, the first word lines WLA and the second word lines WLB may extend to the connection region B, and end portions thereof may have a stepwise structure. In some embodiments, the end portions of the first word lines WLA and the second word lines WLB in the connection region B may be bent and extend in a third direction D3.

The semiconductor memory device may further include a third word line stack and a fourth word line stack, adjacent to the first word line stack and the second word line stack. Structures of the third word line stack and the fourth word line stack may be substantially the same as the structures of the first word line stack and the second word line stack, and thus a description thereof will not be provided here.

The first to fourth word line stacks may constitute one memory block. In some embodiments, the first word line stack and the second word line stack may constitute one memory block.

A string selection line SSL of the first word line stack and a string selection line SSL of the second word line stack may be physically and electrically separated from each other.

In the cell array region A, the first word line stack to the fourth word line stack may be separated from one another by the isolation region 121. In some embodiments, the first word line stack and the second word line stack may be partially connected to one another in the connection region B. For example, the word lines WL0-WL3 and the dummy word lines DM of the first word line stack may be connected with the word lines WL0-WL3 and the dummy word lines DM of the second word line stack.

In some embodiments, the first word line stack to the fourth word line stack may be at least partially connected to one another in the connection region B. For example, the word lines WL0-WL3 and the dummy word lines DM of the first word line stack to the fourth word line stack may be connected to each other.

The first word line stack to the fourth word line stack may be connected to one another by bridges BG. In particular, the word lines WL0-WL3 of the first word line stack may be connected to the corresponding word lines WL0-WL3 of the second to fourth word line stacks by bridges BG. The dummy word lines DM of the first word line stack may be connected to the corresponding dummy word lines DM of the second to fourth word line stack by bridges BG. In FIGS. 4A, 4B, and 5, the width of the dummy word line DM2 in the first direction D1 is slightly exaggerated for clear illustration of the bridges BD. The individual horizontal electrodes may protrude with substantially the same width in the first direction D1.

The ground selection line GSL of the first word line stack and the ground selection line GSL of the second word line stack may be physically separated from one another. The ground selection line GSL of the first word line stack may be physically connected to or may be integrated with the ground selection line GSL of the second word line stack. However, when the ground selection line GSL of the first word line stack is physically separated from the ground selection line GSL of the second word line stack, improved electrically characteristics such as high operation speed may be attained.

As described above, the word lines WL0-WL3 and the dummy word lines DM of the first to fourth word line stacks may be connected to the other word lines WL0-WL3 and the other dummy word line DM of the first to fourth word line stacks by bridges BG. Thus, any one of the word lines WL0 to WL3 and the dummy word lines DM of the first to fourth word line stacks may be connected to the peripheral circuit region by only one upper wiring. In particular, the word lines WL3 of the first to fourth word line stacks may be connected to the peripheral circuit region only by an upper wiring UL3. Each word line stack does not need an upper wiring for connecting the corresponding layers on the same level to the peripheral circuit region, because the word lines of the different word line stacks on the corresponding layer at the same level are connected to one another by a bridge BG.

Such bridges may be formed at the same time as when the isolation regions 121 for isolating the first to fourth word line stacks are formed. However, this may cause the ground selection lines GSL at the lowermost level to be connected by the bridges BG. To prevent this, portions of the ground selection lines GSL that correspond to the bridges BG may be previously removed.

FIG. 6 is a plan view illustrating that portions of the ground selection lines GSL that correspond to a bridge BG are removed, according to an example embodiment.

Referring to FIG. 6, the ground selection line GSL of the first word line stack and the ground selection line GSL of the second word line stack may be isolated from each other by a local planarized region LPR. The outer contour line of the local planarized region LPR may not match the outer contour line of the bridge BG that is to be placed on the local planarized region LPR.

As the local planarized region LPR is formed to isolate the ground selection lines GSL of adjacent two of the word line stacks from each other, an empty space defined on the exposed surface region of the local planarized region LPR by a total height of the ground selection line GSL and the corresponding buffer dielectric film 122 (see FIG. 7A) may be formed. The empty space may be at least partially filled by a protruding portion of the substrate 110 or a filler F such as an insulating layer. The insulating layer may be, for example, a silicon oxide layer.

Each of the ground selection lines GSL may have a recess GV that is laterally recessed on a side thereof near the local planarized region LPR. As illustrated in FIG. 6, while linearly extending, the ground selection line GSL may include the recess GV in a side region at the local planarized region LPR, wherein the recess GV may be at least partially filled by the filler F.

Figure 7A:
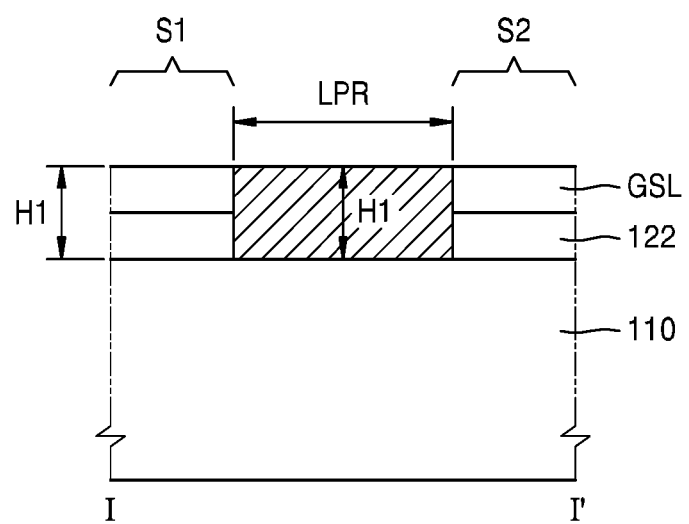
FIGS. 7A to 7C are side cross-sectional views taken along line I-I' of FIG. 6, according to example embodiments.
Figure 7B:
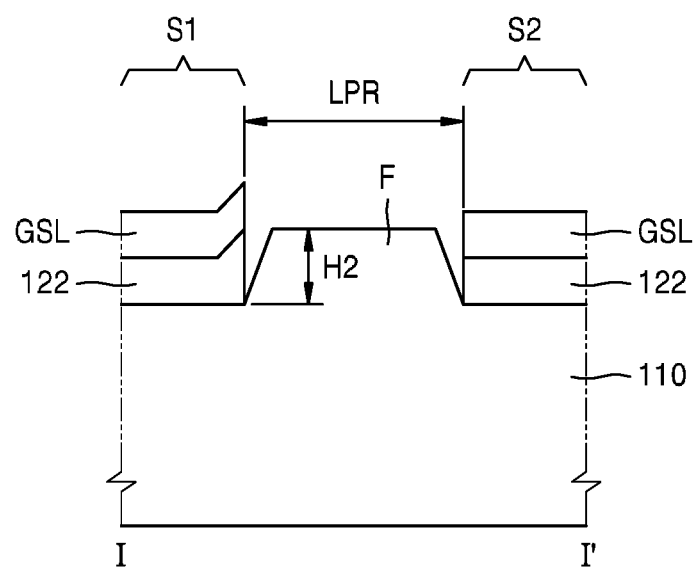
Figure 7C:
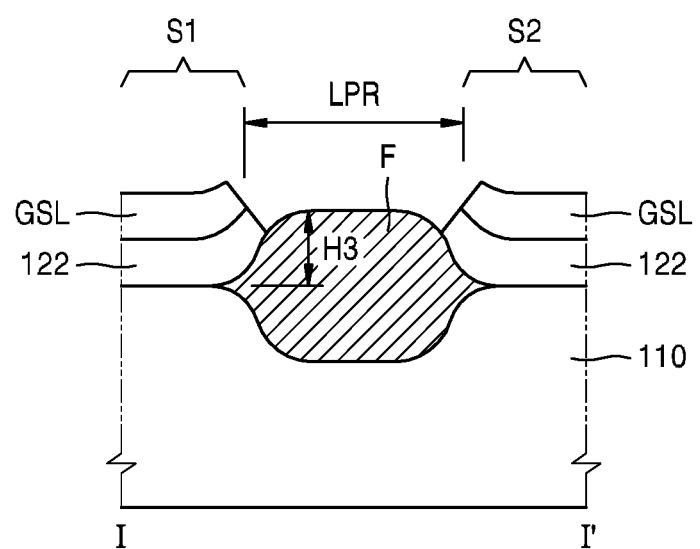

FIGS. 7A to 7C are side cross-sectional views taken along line I-I' of FIG. 6, according to embodiments.

Referring to FIG. 7A, the filler F may at least partially fill the space in the local planarized region LPR. The space may be filled with the filler F by using a method such as chemical vapor deposition (CVD), physical vapor deposition (PVD), or atomic layer deposition (ALD). The filler F may not fully fill the space. For example, a maximum thickness of the filler F in the third direction D3 may be about 40% to about 140%, and in some embodiments, about 70% to about 120% of a total thickness H1 of the ground selection line GSL and the buffer dielectric film 122.

In some embodiments, an upper surface of the filler F may be on substantially the same plane as an upper surface of the ground selection line GSL. To this end, after a material layer of the filler F is formed by, for example, CVD, to fully fill the space and cover the upper surface of the ground selection line GSL, the material layer may then be planarized using, for example, an etch back process or chemical mechanical polishing (CMP).

As will be described later with reference to FIGS. 10A to 10I, the ground selection line GSL may be formed by forming a sacrificial layer in a region where the ground selection line GSL is to be formed and substituting the sacrificial layer with a conductive material. In this case, after a material layer of the filler F is formed by, for example, CVD, to completely fill the space and cover the upper surface of the sacrificial layer, the material layer of the filler F may then be planarized.

A side edge portion of the local planarized region LPR may contact the first word line stack S1, and the opposite side edge portion of the local planarized region LPR may contact the second word line stack S2. Although not illustrated in FIG. 7A, the word lines WL0-WL3 and the dummy word lines DM1 and DM2 may be further stacked on each of the respective ground selection lines GSL of the two adjacent (first and second) word line stacks S1 and S2, and the corresponding word lines WL0-WL3 and dummy word lines DM1 and DM2 of the first and second word line stacks S1 and S2 may be connected to each other on the local planarized region LPR.

FIG. 7B is a side cross-sectional view taken along line I-I' of FIG. 6 illustrating a filler F according to an example embodiment.

Referring to FIG. 7B, the space defined by a total height of the ground selection line GSL and the buffer dielectric film 122 that corresponds to the ground selection line GSL may be at least partially filled by a protruding portion of the substrate 110. The filler F may be a protruding portion of the substrate 110 that vertically protrudes from the upper surface of the substrate 110, i.e., in the third direction D3. The protruding portion of the substrate 110 may have a mesa-like shape. In some embodiments, the protruding portion of the substrate 110 may have slanted sides.

An upper surface of the protruding portion of the substrate 110 may be higher with respect to upper surfaces of the substrate 110 under the first word line stack S1 and/or the second word line stack S2.

A protrusion height H2 of the substrate 110 may be about 40% to about 140%, and in some embodiments, about 70% to about 120% of the total height H1 of the ground selection line GSL and the buffer dielectric film 122. For example, the protrusion height H2 of the substrate 110 may be about 20 Å to about 300 Å, and in some embodiments, about 50 Å to about 200 Å.

As illustrated in FIG. 7B, a portion of each of the ground selection line GSL and the buffer dielectric film 122 that is adjacent to the local planarized region LPR may have a planar surface as in the second word line stack S2. In some embodiments, each of the ground selection line GSL and the buffer dielectric film 122 may have a surface that may gradually rise towards the local planarized region LPR as in the first word line stack S1.

In FIG. 7B, the buffer dielectric film 122 is illustrated as being partially removed to expose the protruding portion of the substrate 110 through the buffer dielectric film 122. However, in some embodiments, the buffer dielectric film 122 may totally or partially cover the upper surface of the protruding portion of the substrate 110.

FIG. 7C is a side cross-sectional view taken along line I-I' of FIG. 6 illustrating a filler F according to another embodiment.

Referring to FIG. 7C, the filler F in the local planarized region LPR may have a shape that may become thinner toward opposite edge portions, and in particular, a shape having a bird's beak-like cross-section. Such a bird's beak-like cross-section of the filler F may be obtained by thermally oxidizing the substrate 110.

At a maximum thickness in the third direction D3 of the filler F, a height difference H3 between the planar upper surface of the substrate 110 and the upper surface of the filler F may be about 40% to about 140% of the total thickness of the ground selection line GSL and the buffer dielectric film 122. In some embodiments, the height difference H3 may be about 70% to about 120% of the total thickness of the ground selection line GSL and the buffer dielectric film 122.

In some embodiments, a height to depth ratio of the filler F, i.e., a ratio of the height of the filler F ranging from the planar upper surface of the substrate 110 to the upper surface of the filler F to the depth of the filler F ranging from the planar supper surface of the substrate 110 to the lower surface of the filler F, may be from about 50:50 to about 60:40, and in some other embodiments, about 54:46.

In some other embodiments, a surface region of each of the ground selection line GSL and the buffer dielectric film 122 near the local planarized region LPR may gradually rise toward the local planarized region LPR. These gradually rising surface regions may be attributed to the filler F having a bird's beak-like shape.

Figure 8:
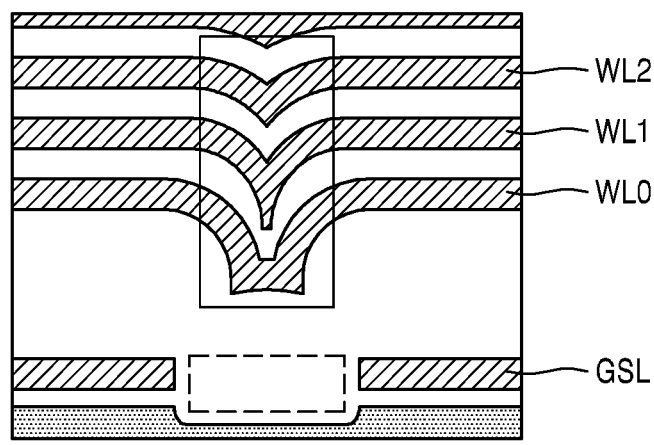
FIG. 8 is a cross-sectional view of a bridge region when a ground selection line and word lines are formed without a filler.

FIG. 8 is a cross-sectional view of a bridge when the ground selection line GSL and the word lines WL0, WL1, and WL2 are formed without a filler F.

Referring to FIG. 8, in a region (denoted by a dashed rectangle) where the ground selection line GSL is disconnected, the word lines WL0, WL1, and WL2 stacked on the region and insulators thereof may have a dented cross-sectional shape, due to the conformal deposition of the word lines and insulators. In such a semiconductor device, an electric field may concentrate on the dented portion (denoted by a solid-line rectangle) during operation, and thus failure such as a breakdown may occur.

Therefore, the disconnected region (denoted by the dashed line) of the ground selection line GSL may be required to be at least partially filled with the filler F, as illustrated in FIGS. 7A to 7C.

Figure 9:
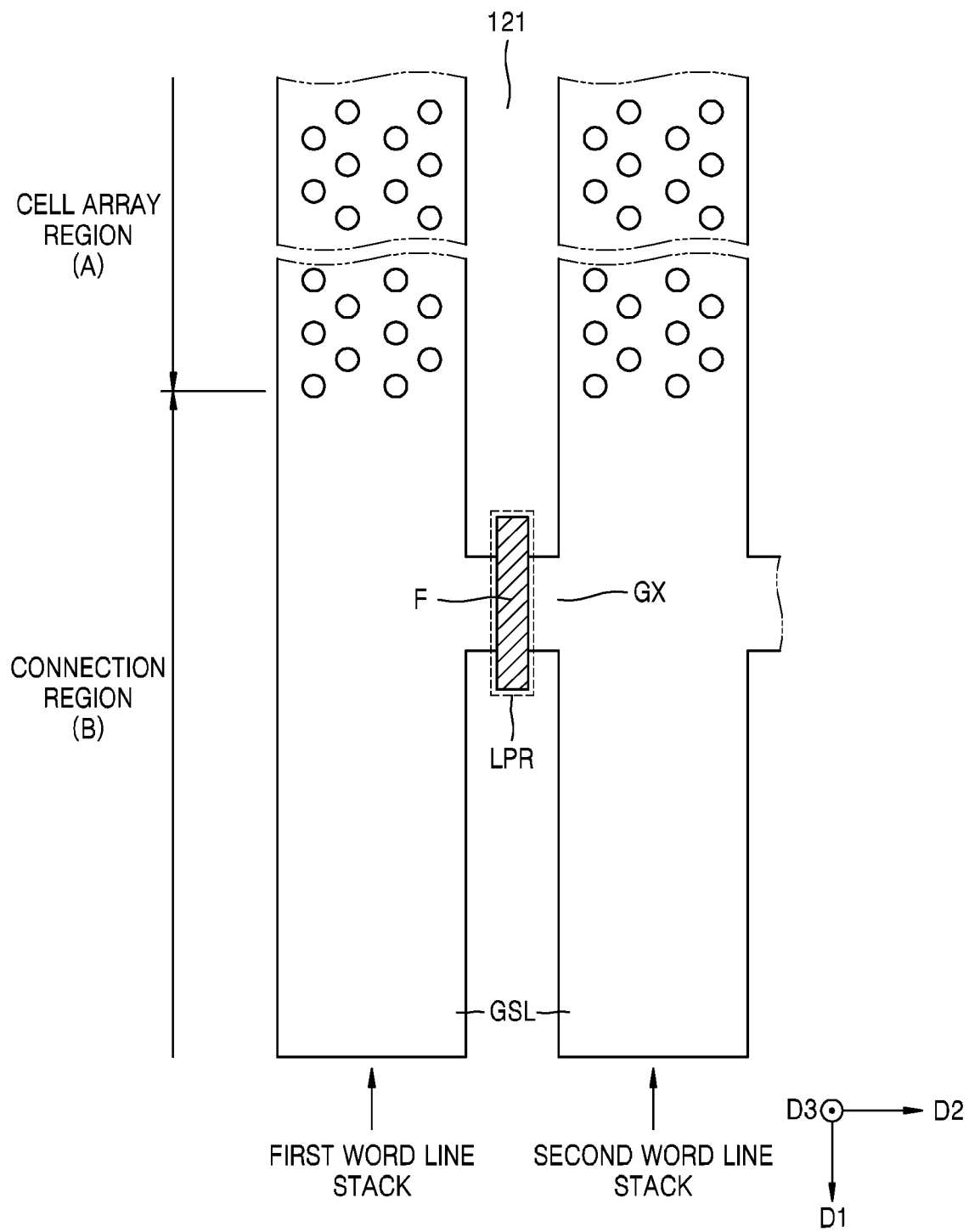
FIG. 9 is a plan view illustrating that a portion of a ground selection line that corresponds to a bridge is removed, according to another example embodiment.

FIG. 9 is a plan view illustrating that a portion of a ground selection line GSL that corresponds to a bridge BG is removed, according to another embodiment.

Referring to FIG. 9, a local planarized region LPR may be provided between the ground selection line GSL of the first word line stack and the ground selection line GSL of the second word line stack. In some embodiments, each of the ground selection line GSL of the first word line stack and the ground selection line GSL of the second word line stack may have a protruding portion GX on a side thereof, the protruding portion GX extending toward the local planarized region LPR. As illustrated in FIG. 9, the ground selection line GSL may have a side that linearly extends with a protruding portion GX adjacent to the local planarized region LPR.

The ground selection line GSL of the first word line stack may be isolated from the ground selection line GSL of the second word line stack by the local planarized region LPR. The outer contour line of the local planarized region LPR may not match with the outer contour line of the bridge BG thereon.

FIGS. 10A to 10I are side sectional views illustrating a method of manufacturing a semiconductor memory device in order, according to an example embodiment. In FIGS. 10A to 10I, cross-sections A-A' and B-B' are taken along lines A-A' and B-B' of FIG. 5, respectively.

Figure 10A:

Referring to FIG. 10A, a substrate 110 is provided. The substrate 110 may include Si, Ge, or SiGe. In some embodiments, the substrate 110 may include a silicon-on-insulator (SOI) substrate or a germanium-on-insulator (GeOI) substrate. The substrate 110 may be of a first conductive type, for example, a p-type conductivity.

A buffer dielectric film 122 may be formed on the substrate 110. The buffer dielectric film 122 may be, for example, a silicon oxide layer. The buffer dielectric film 122 may be formed by, for example, a thermal oxidation process. In some embodiments, the buffer dielectric film 122 may include a middle temperature oxide (MTO).

A sacrificial layer 123, which may be used later to form a ground selection line GSL, may be provided on the buffer dielectric film 122. The sacrificial layer 123 may include a material having different wet-etching characteristics with respect to the buffer dielectric film 122 and insulating layers 124 (see FIG. 10B, which will be described later). The sacrificial layer 123 may include, for example, a silicon nitride layer, a silicon oxynitride layer, a polysilicon layer, or a polysilicon germanium layer. The sacrificial layer 123 may be formed by, for example, a CVD method.

The sacrificial layer 123 and the buffer dielectric film 122 may be at least partially removed from a local planarized region LPR. In some embodiments, the sacrificial layer 123 and the buffer dielectric film 122 may be totally removed from the local planarized region LPR. In some other embodiments, only the sacrificial layer 123 may be removed so that the buffer dielectric film 122 remains on the local planarized region LPR. The sacrificial layer 123 and the buffer dielectric film 122 may be selectively removed to define the local planarized region LPR by a photolithography process.

Through the photolithography process, an empty space may be defined in the exposed surface region of the local planarized region LPR by a total height of the sacrificial layer 123 and the buffer dielectric film 122.

Figure 10B:
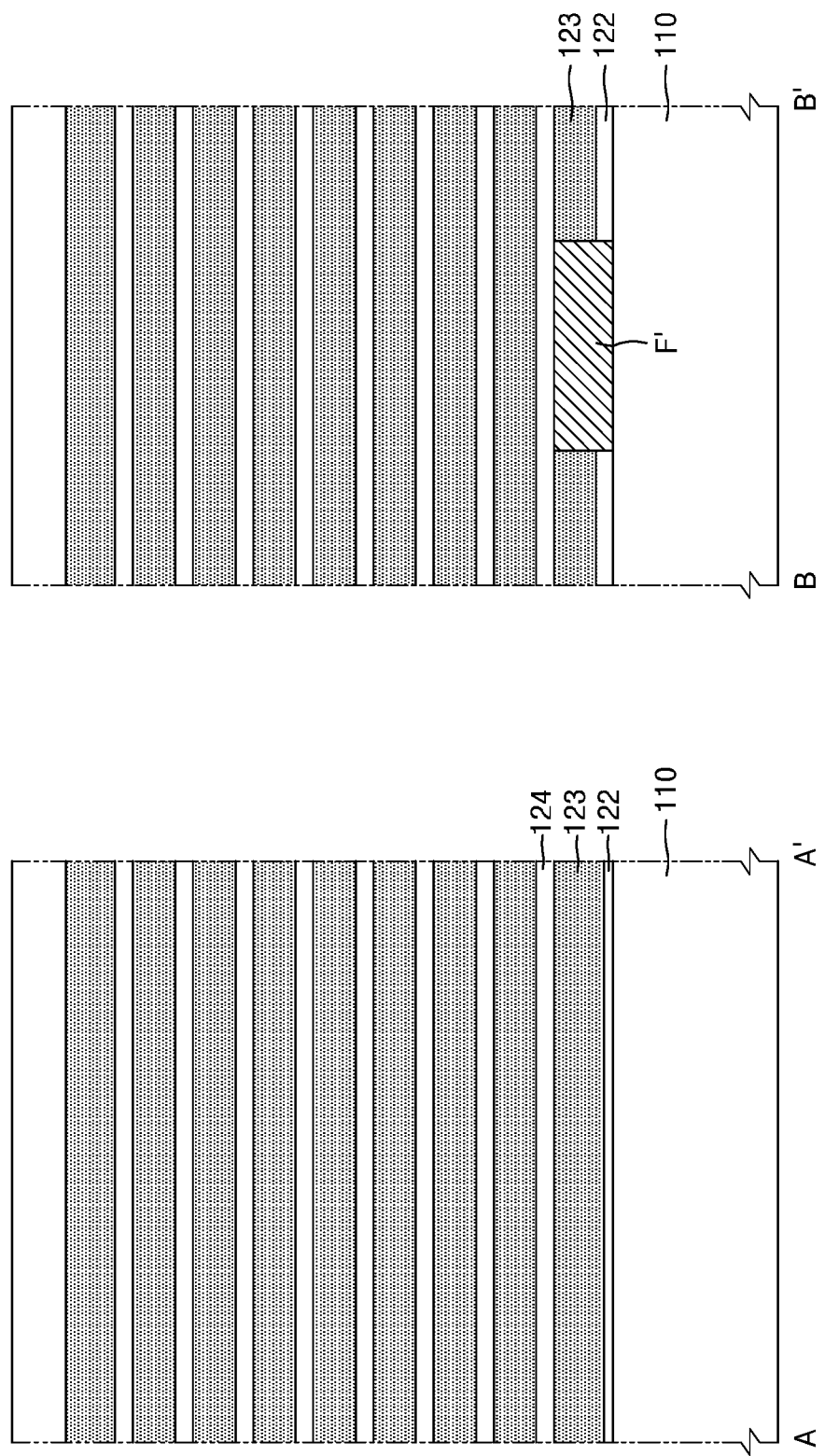

Referring to FIG. 10B, the empty space defined by the total height of the sacrificial layer 123 and the buffer dielectric film 122 and the exposed surface region of the local planarized region LPR may be at least partially filled with a filler F' such as an oxide. The filler F' may be an insulating layer formed of, for example, a protruding portion of the substrate 110 or a silicon oxide. An example embodiment of the filler F' as a protruding portion of the substrate 110 will be described later in greater detail.

When the filler F' is formed of a silicon oxide, the empty space may be filled by a deposition method or a thermal oxidation, or a local oxidation of silicon (LOCOS) method. The deposition method may be, for example, CVD, ALD, or PVD. However, embodiments are not limited thereto.

When formed by a thermal oxidation method, the filler F' may have an edge having a bird's beak-like cross-sectional shape, which is described above with reference to FIG. 7C, and thus a detailed description thereof will be omitted herein.

Subsequently, additional sacrificial layers 123 and insulating layers 124 may be alternately stacked on the buffer dielectric film 122. The uppermost insulating layer 124 may have a greater thickness than the other insulating layers 124. The insulating layers 124 may be, for example, silicon oxide layers. The sacrificial layers 123 may include a material that exhibits different wet-etching characteristics with respect to the buffer dielectric film 122 and the insulating layers 124. The sacrificial layers 123 may include, for example, a silicon nitride layer, a silicon oxynitride layer, a polysilicon layer, or a polysilicon germanium layer. The sacrificial layers 123 and the insulating layers 124 may be formed by, for example, an alternating stack deposition with conformal CVD, depositing the plurality of layers without any intervening photolithography or etch processes. A stack formed thusly may be referred to as a conformal CVD stack.

If the sacrificial layers 123 and the insulating layers 124 are stacked without filling the empty space in the local planarized region LPR with the filler F', a structure having a dented cross-sectional shape as illustrated in FIG. 8, due to the overlapping of the dented portions in the sacrificial layers 123 and the insulating layers 124, may result in, so that an electric field may concentrate on a region of horizontal electrodes, which will be formed later on the local planarized region LPR, causing product failure such as a breakdown.

Figure 10C:
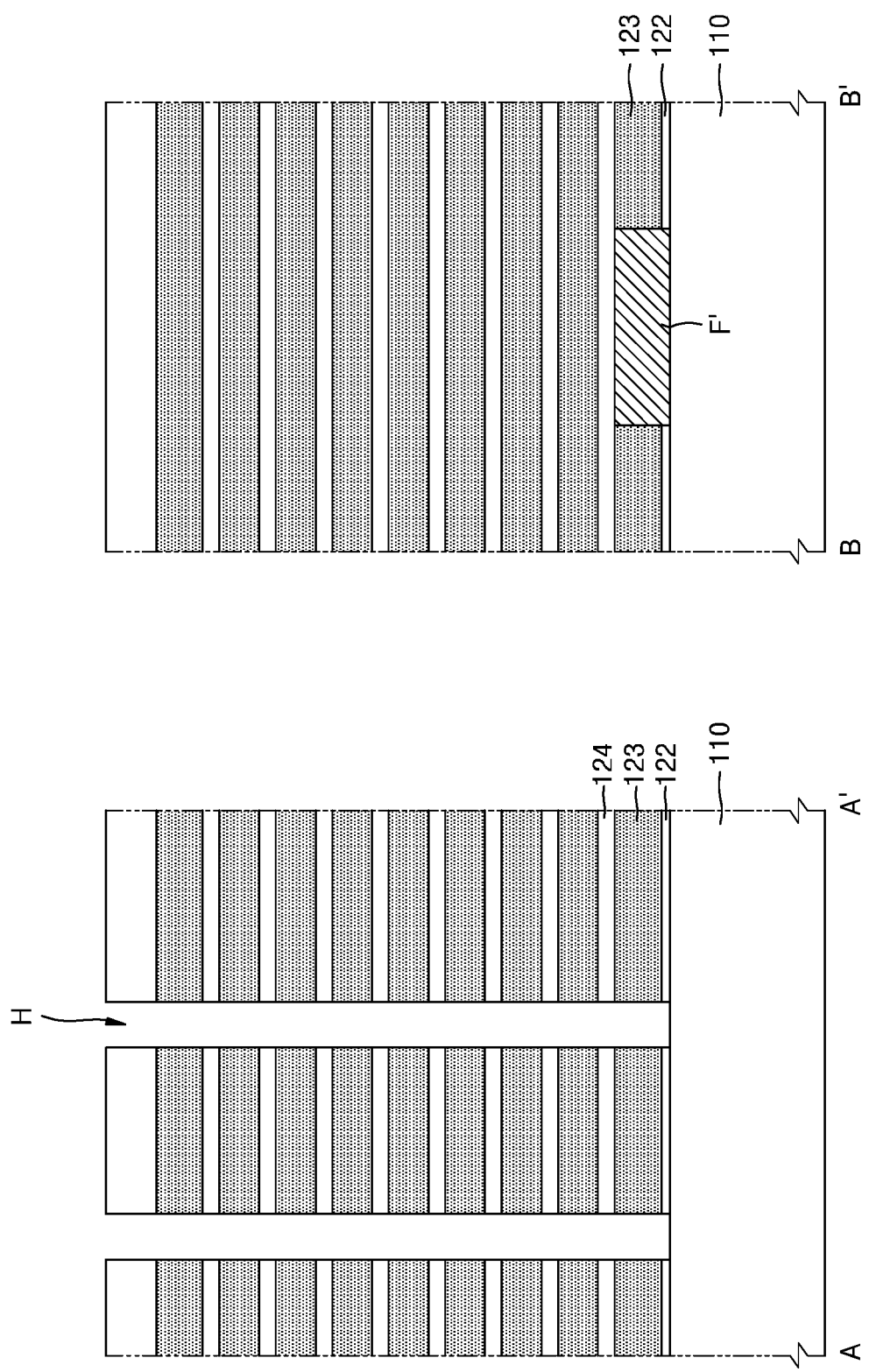

Referring to FIG. 10C, cell holes H may be formed through the buffer dielectric film 122, the sacrificial layers 123, and the insulating layers 124 to expose the substrate 110. The cell holes H may be formed by, for example, a photolithography process.

Figure 10D:
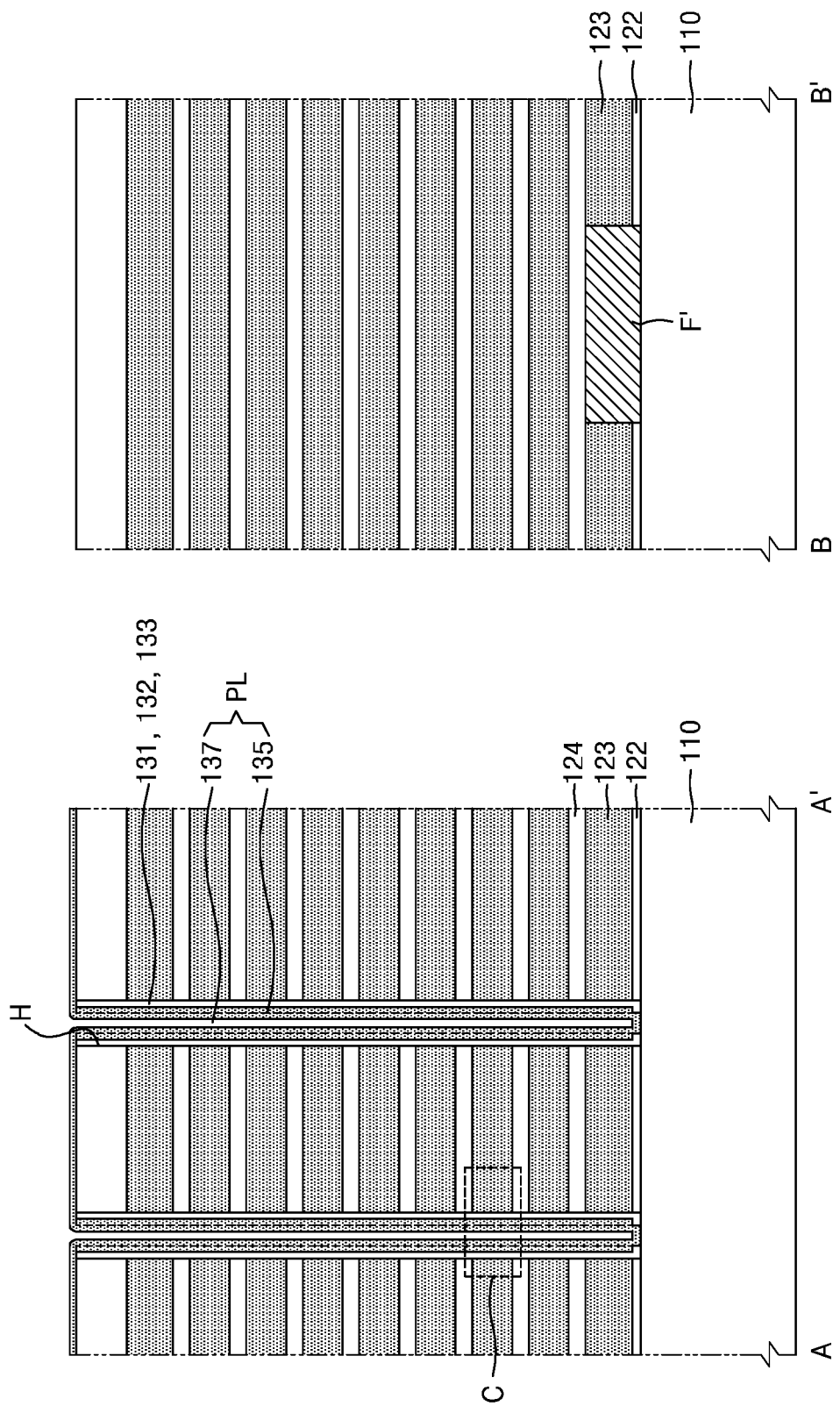
Figure 10E:
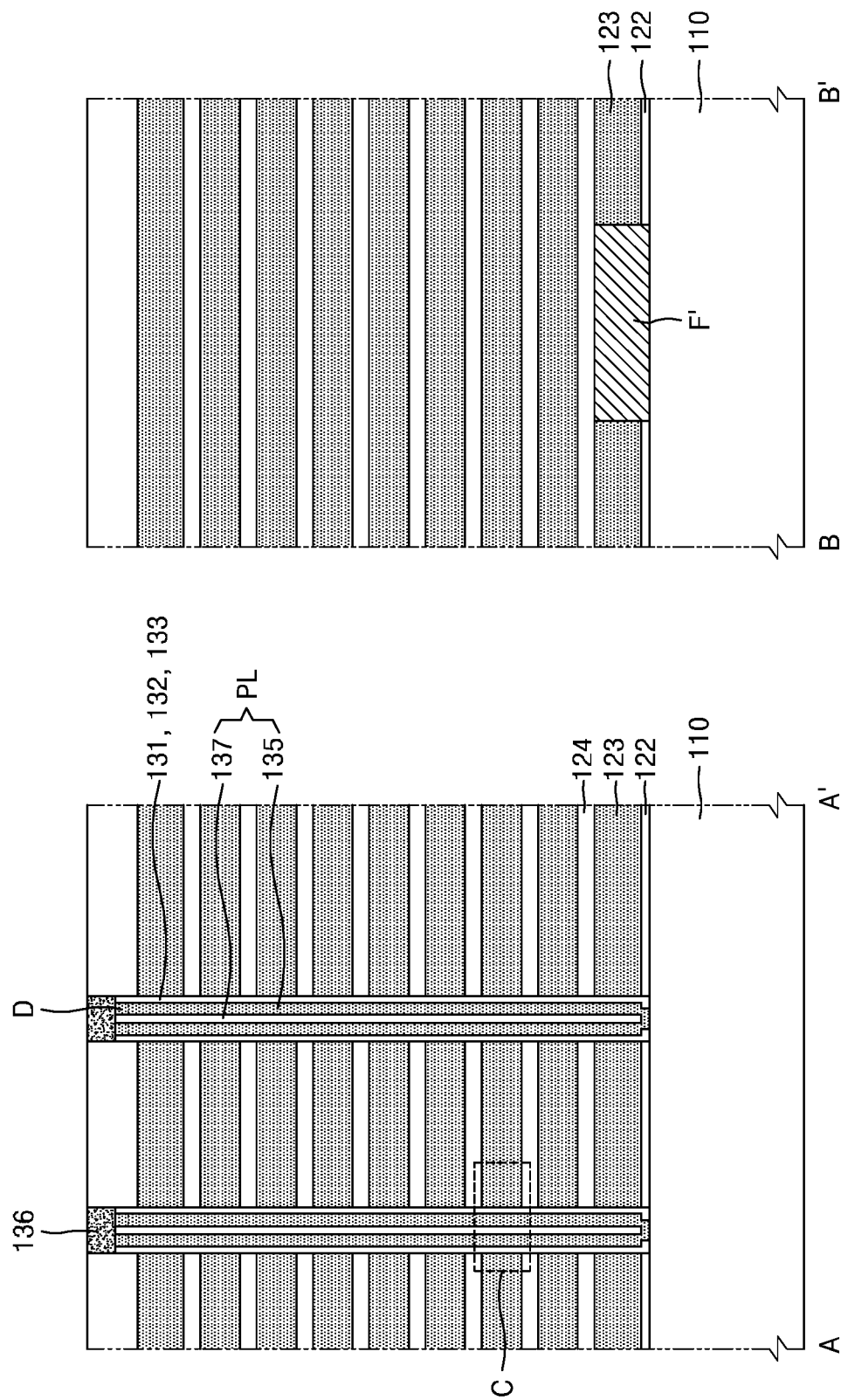

Referring to FIGS. 10D and 10E, cell columns PL may then be formed in the cell holes H. A process of forming the cell columns PL will be described below in greater detail with reference to FIGS. 11 and 12, which are enlarged views of region C in FIGS. 10D and 10E, respectively.

Figure 11:
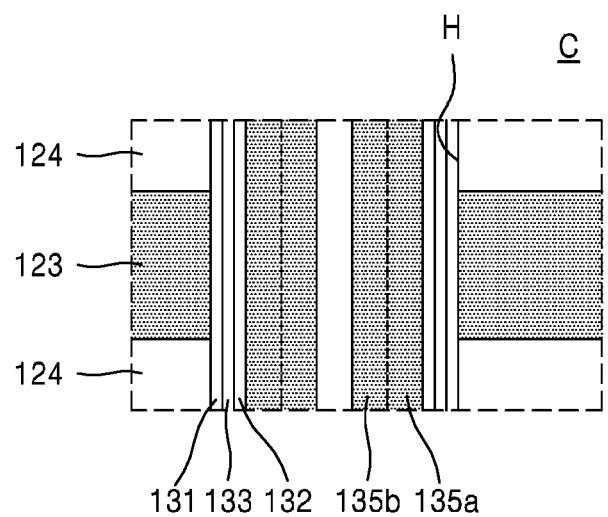
FIG. 11 is a partial enlarged view of region C in FIG. 10D.

Referring to FIGS. 10D and 11, a protective layer 131 may be formed on a sidewall of each of the cell holes H. The protective layer 131 may be a silicon oxide layer. A charge storage layer 133 may be formed on the protective layer 131. The charge storage layer 133 may be a charge trapping layer or an insulating layer including conductive nanoparticles. The charge trapping layer may include, for example, a silicon nitride layer. A tunnel insulating layer 132 may be formed on the charge storage layer 133. The tunnel insulating layer 132 may be a silicon oxide layer. The protective layer 131, the tunnel insulating layer 132, and the charge storage layer 133 may be formed by ALD or CVD.

A first sub-semiconductor layer 135a may be formed on the tunnel insulating layer 132. The first sub-semiconductor layer 135a may then be anisotropically etched to expose the substrate 110. The first sub-semiconductor layer 135a may remain as a spacer layer on the sidewall of the tunnel insulating layer 132. A second sub-semiconductor layer 135b may be formed on the first sub-semiconductor layer 135a. The second sub-semiconductor layer 135b may contact the substrate 110. The first and second sub-semiconductor layers 135a and 135b may be formed by ALD or CVD. The first and second sub-semiconductor layers 135a and 135b may be amorphous silicon layers.

Figure 12:
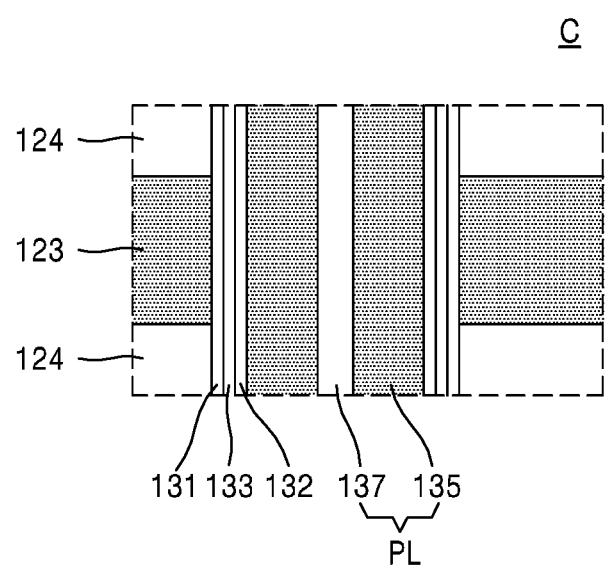
FIG. 12 is a partial enlarged view of region C in FIG. 10E.

Referring to FIGS. 10E and 12, the first and second sub-semiconductor layers 135a and 135b may be changed into a semiconductor layer 135 through a thermal treatment process. The semiconductor layer 135 may be a polysilicon layer or a crystalline silicon layer.

The semiconductor layer 135 may be formed not to fully fill the cell holes H, and an insulating material may then be deposited on the semiconductor layer 135 to fully fill the cell holes H. The semiconductor layer 135 and the insulating material may then be planarized to expose the uppermost insulating layer 124. Accordingly, cylindrical semiconductor columns PL filled with a filling insulating layer 137 may be formed. The semiconductor columns PL may be first conductive type semiconductor layers. Unlike FIGS. 10E and 12, the semiconductor layer may be formed to fully fill the cell holes H. This embodiment does not need to form the filling insulating layer 137.

Upper portions of the cell columns PL may be recessed lower than the uppermost insulating layer. A conductive pattern 136 may be formed in the recessed upper portion of each of the cell columns PL in the cell holes H. The conductive pattern 136 may be doped polysilicon or metal. Impurity ions of a second conductive type may be implanted into upper portions of the conductive pattern 136 and the cell columns PL to form drain regions D. The second conductive type may be, for example, an N-type.

Referring to FIG. 10F, the buffer dielectric film 122, the sacrificial layers 123, and the insulating layers 124 may be continuously patterned to form isolation regions 121 that extend in a first direction D1, separated from one another to partially expose the substrate 110. As a result of the patterning, insulating patterns 125 may be formed from the insulating layers 124, and edge portions of the filler F' may be partially removed, resulting in a filler F. As a result, the sacrificial layers 123 may be divided in regions where the ground selection lines GSL are to be formed.

Prior to the patterning, the uppermost insulating layer 124 and sacrificial layer 123 between the isolation regions 121 may be patterned to form an opening 127. The opening 127 may extend between the isolation regions 121 in the first direction D1 to thereby divide the uppermost sacrificial layer 123 into two. The opening 127 may be filled with an insulating layer, for example, a silicon oxide layer.

Figure 10G:
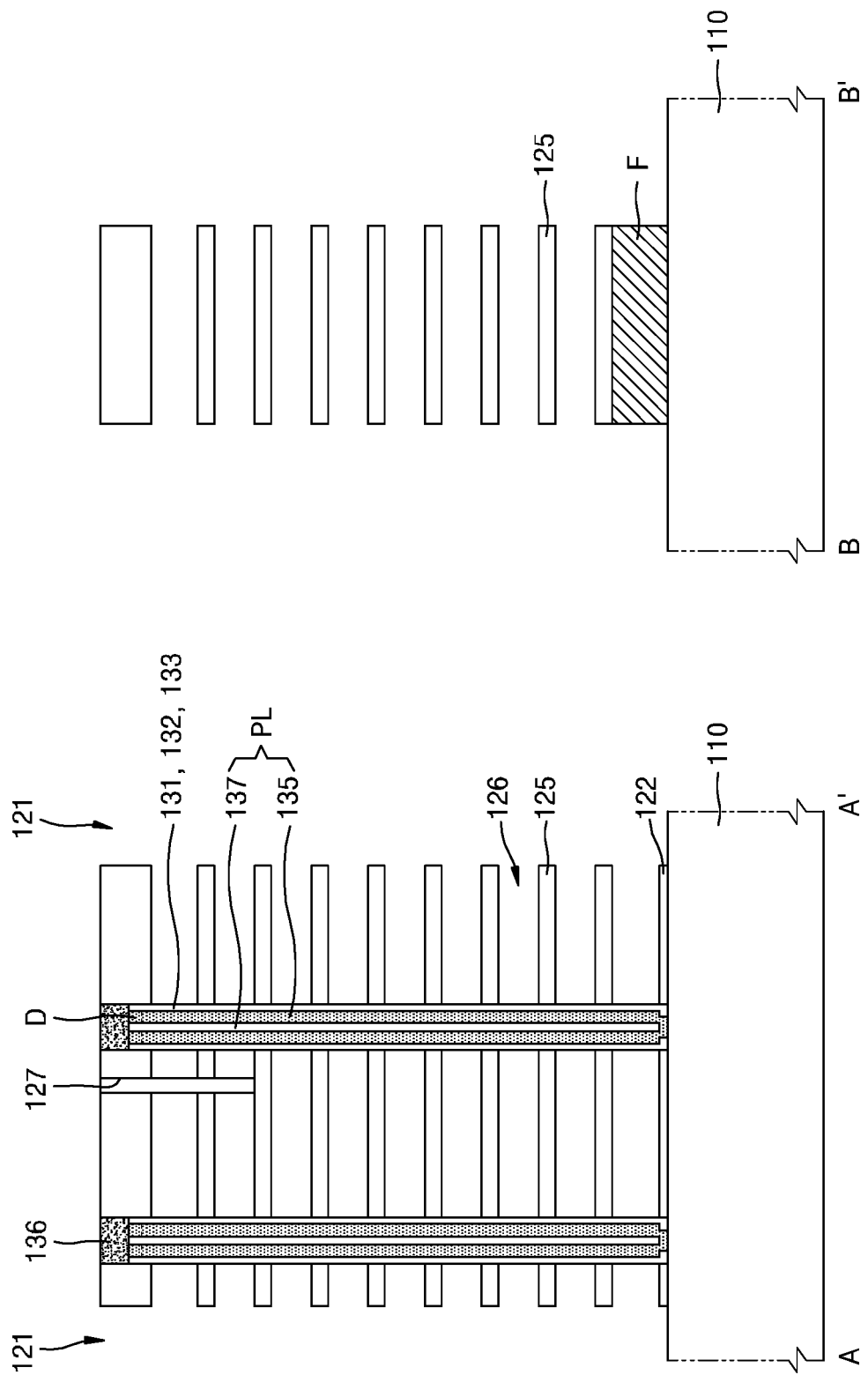

Referring to FIG. 10G, the sacrificial layers 123 exposed by the isolation regions 121 may be selectively removed to form recess regions 126. The recess regions 126, as regions from which the sacrificial layers 123 are removed, may be defined by the cell columns PL and the insulating patterns 125. When the sacrificial layers 123 include a silicon nitride layer or a silicon oxynitride layer, the sacrificial layers 123 may be removed using an etchant including phosphoric acid. A side wall of the cell columns PL may be partially exposed through the recess regions 126.

The protective layer 131 may prevent damage to the charge storage layer 133 caused by an etchant used to remove the sacrificial layers 123. Portions of The protective layer 131 exposed by the recess regions may be selectively removed. When the protective layer 131 is a silicon oxide layer, the protective layer 131 may be removed by, for example, an etchant including fluoric acid, so that a portion of the charge storage layer 133 may be exposed through the recess regions 126.

To make formation of the cell holes H easier, a total height of the stack of the sacrificial layers 123 and the insulating layers may be reduced. Accordingly, the cell holes H may have a reduced aspect ratio. This may facilitate etching the stack of the sacrificial layers 123 and the insulating layers 124. When the number of stacked layers is the same, the total height of the stack may be reduced by reducing the thickness of each of the sacrificial layers 123 and/or the thickness of each of the insulating layers 124.

Referring to FIG. 10H, a blocking dielectric layer 134 may be formed in the recess regions 126. The blocking dielectric layer 134 may be conformally formed on upper and lower surfaces of the insulating patterns 125 and on the charge storage layer 133 exposed in the recess regions 126. The blocking dielectric layer 134 may include a high-k dielectric layer, for example, an aluminum oxide layer or a hafnium oxide layer. The blocking dielectric layer 134 may be a multilayer structure including a plurality of thin layers. For example, the blocking dielectric layer 134 may include an aluminum oxide layer and a silicon oxide layer, wherein the aluminum oxide layer and the silicon oxide layer may be stacked in any of a variety of stacking orders. The blocking dielectric layer 134 may be formed by ALD and/or CVD with a good step coverage.

Subsequently, a conductive layer 140 may be formed on the blocking dielectric layer 134. The conductive layer 140 may include at least one of a doped silicon layer, a metal layer, a metal nitride layer, and a metal silicide layer. The conductive layer 140 may be formed by CVD or ALD. For example, the conductive layer 140 may include a barrier layer, and a metal layer on the barrier layer. The barrier layer may be a metal nitride layer, for example, a titanium nitride layer. The metal layer may be, for example, a tungsten layer. In some other embodiments, the conductive layer 140 may include a polysilicon layer, and a silicide layer on the polysilicon layer, wherein the conductive layer 140 may be formed by forming a polysilicon layer, removing portions of the polysilicon layer adjacent to the isolation region 121 to form recesses in the polysilicon layer, forming a metal layer on the polysilicon layer having the recesses, thermally treating the metal layer to form a silicide layer, and removing an unreacted portion of the metal layer. The metal layer used to form the silicide layer may include tungsten, titanium, cobalt, or nickel.

Figure 13:
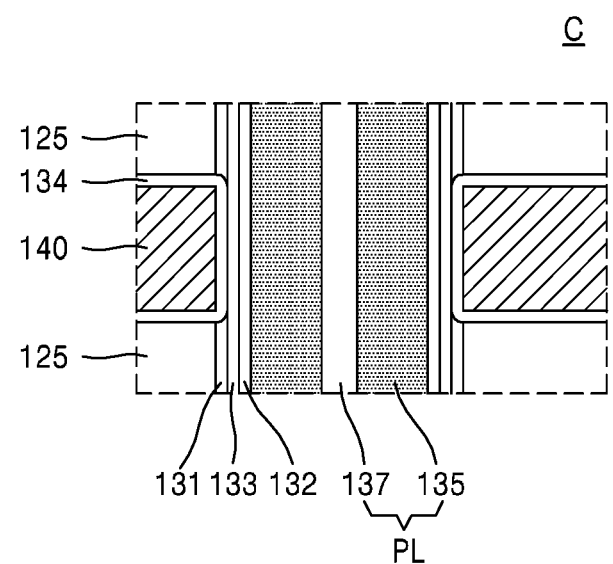
FIG. 13 is a partial enlarged view of region C in FIG. 10H.

FIG. 13 is a partial enlarged view of region C in FIG. 10H.

Referring to FIG. 13, only the blocking dielectric layer 134 may be formed in the recess regions 126, whereas the tunnel insulating layer 132 and the charge storage layer 133 may be formed in the cell holes H.

In some embodiments, all the tunnel insulating layer 132, the charge storage layer 133, and the blocking dielectric layer 134, which may constitute the data storage element 130, may be formed in the recess regions 126 (see FIG. 10G). In this case, the protective layer 131 may not be formed. In the processes of FIGS. 10A to 10E, the cell columns PL may be formed without forming the protective layer 131, the charge storage layer 133, and the tunnel insulating layer 132 in the cell holes H. The cell columns PL may be formed by depositing a semiconductor layer in the cell holes H. Then, in the process of FIG. 10H, the tunnel insulating layer 132, the charge storage layer 133, and the blocking dielectric layer 134 may be sequentially formed in the recess regions 126. Next, the conductive layer 140 may be formed on the blocking dielectric layer 134.

In some embodiments, the charge storage layer 133 and the blocking dielectric layer 134 may be formed in the recess regions 126. In the processes of FIGS. 10D to 10E, after the protective layer 131 and the tunnel insulating layer 132 are formed in the holes H, the cell columns PL may be formed. The cell columns PL may be formed in a similar manner as in the processes of FIGS. 10D to 10E. Next, in the process of FIG. 10H, the charge storage layer 133 and the blocking dielectric layer 134 may be sequentially formed in the recess regions 126. Then, the conductive layer 140 may be formed on the blocking dielectric layer 134.

In some embodiments, all the tunnel insulating layer 132, the charge storage layer 133, and the blocking dielectric layer 134, which may constitute the data storage element 130, may be formed in the cell holes H. In the processes of FIGS. 10D to 10E, the protective layer 131, the blocking dielectric layer 134, the charge storage layer 133, and the tunnel insulating layer 132 may be sequentially formed in the cell holes H. The cell columns PL may be formed on the tunnel insulating layer 132. The cell columns PL may be formed in a similar manner as in the processes of FIGS. 10D to 10E. Next, in the process of FIG. 10H, the conductive layer 140 may be formed in the recess regions 126.

In some embodiments, the data storage element 130 may be a variable resistance pattern. The variable resistance pattern may include at least one of materials having variable resistance characteristics.

For example, the data storage element 130 may include a material (for example, a phase change material) having an electrical resistance that may be changed by heat generated by an electric current that passes through an adjacent electrode. The phase change material may include at least one of antimony (Sb), tellurium (Te), and selenium (Se). For example, the phase change material may include about 20 Atom % to about 80 Atom % of tellurium (Te), about 5 Atom % to about 50 Atom % of antimony (Sb), and the balance of germanium (Ge) as a chalcogen compound. The phase change material may further include at least one of N, O, C, Bi, In, B, Sn, Si, Ti, Al, Ni, Fe, Dy, and La as impurities. In some embodiments, the variable resistance pattern may be formed of one of GeBiTe, InSb, GeSb, and GaSb.

In some embodiments, the data storage element 130 may have a thin-film structure having a variable electrical resistance that may be changed due to spin transfer by an electric field that passes through the thin-film structure. The data storage element 130 may have a thin-film structure having magnetic resistance characteristics. The data storage element 130 may include, for example, at least one ferromagnetic material and/or at least one antiferromagnetic material.

In some other embodiments, the data storage element 130 may include at least one of a perovskite compound and/or a transition metal oxide. For example, the data storage element 130 may include at least one of niobium oxide, titanium oxide, nickel oxide, zirconium oxide, vanadium oxide, PCMO ((Pr,Ca)MnO$_3$), strontium-titanium oxide, barium-strontium-titanium oxide, strontium-zirconium oxide, barium-zirconium oxide, and barium-strontium-zirconium oxide.

In these embodiments, the cell columns PL may be conductive columns. For example, the cell columns PL may be formed of a conductive material. The conductive material may include, for example, at least one of a doped semiconductor, a metal, a conductive metal nitride, a silicide, and a nano structure such as carbon nanotubes or graphene.

To implement the structures as illustrated in FIGS. 11 to 13?, in the processes of FIGS. 10D to 10E, the protective layer 131 and the data storage element 130 may be sequentially formed in the cell holes H. The cell columns PL may be formed on the data storage element 130. The cell columns PL may be formed by depositing a conductive material. Then, in the process of FIG. 10H, the conductive layer 140 may be formed in the recess regions 126.

Subsequently, referring to FIG. 10I, a portion of the conductive layer 140 formed outside the recess regions 26 may be removed, thus to form horizontal electrodes in the recess regions 126. The horizontal electrodes may include the ground selection line GSL, the word lines WL0-WL3, the dummy word lines DM1 and DM2, and the string selection lines SSL1 and SSL2. The string selection lines SSL1 and SSL2 may extend in the first direction D1, and each of the string selection lines SSL1 and SSL2 may be divided into two in the second direction D2.

As the portion of the conductive layer 140 in the isolation regions 121 is removed, a corresponding region of the substrate 110 may be exposed. A high concentration of impurity ions may be provided into the exposed region of the substrate 110 to form the common source lines CSL.

Then, an isolation insulating layer 120 that fills the isolation regions 121 may be formed. The cell columns PL arranged in the second direction D2 may be connected in common to one upper wiring BL1 or BL2 (see FIG. 3).

Figure 14:
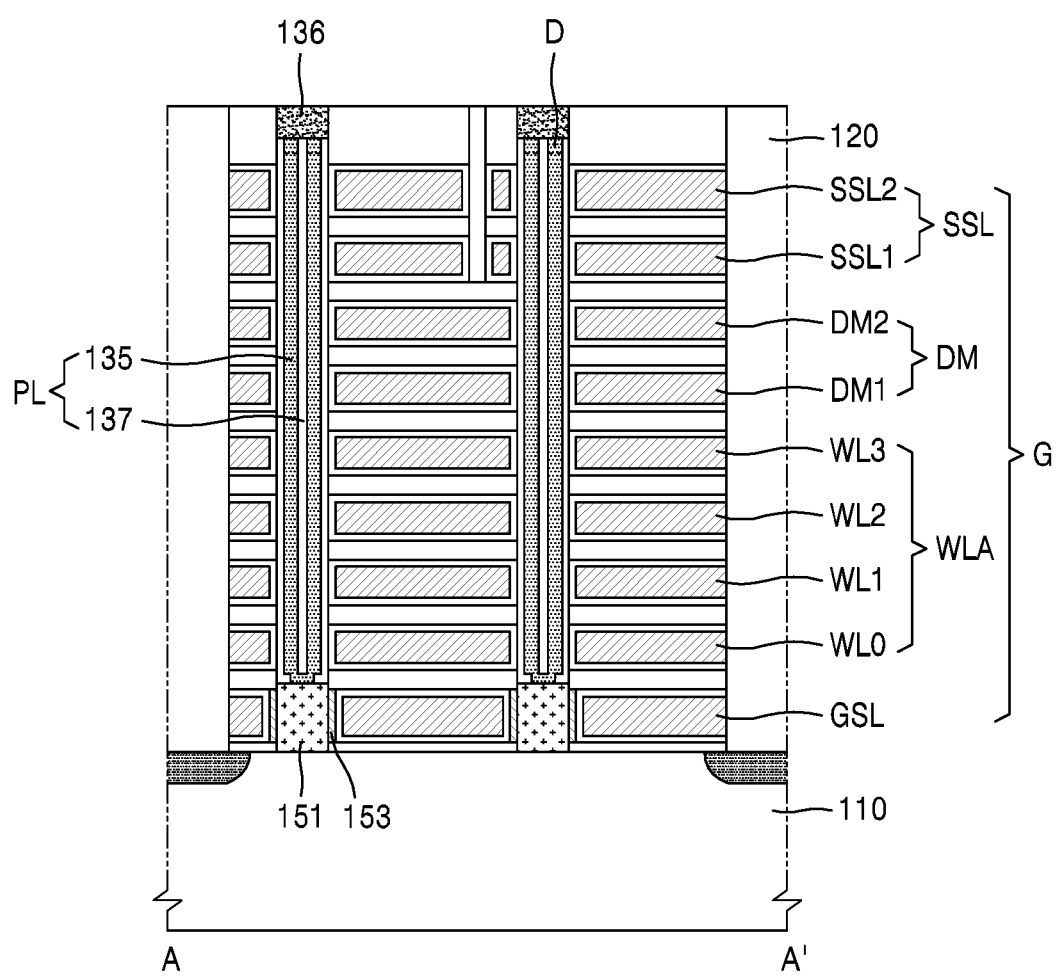
FIG. 14 is a side cross-sectional view illustrating a cell column in a semiconductor memory device according to an example embodiment.

FIG. 14 is a side cross-sectional view illustrating a cell column in a semiconductor memory device according to an example embodiment. In the embodiment of FIG. 14, a channel contact region 151 is further formed in a bottom portion of cell holes H, unlike the embodiment illustrated in FIG. 3. Only the difference from the embodiment of FIG. 3, except for the same structure with the embodiment of FIG. 3, will now be described.

Referring to FIG. 14, after the cell holes H are formed as illustrated in FIG. 10C, a channel contact region 151 may be formed on a region of the substrate 110 that is exposed through each of the cell holes H. In some embodiments, the channel contact region 151 may be formed on the exposed region of the substrate 110 by selective epitaxial growth (SEG). An upper surface of the channel contact region 151 may be at a level higher than an upper surface of the lowermost sacrificial layer 123.

Then, p-type impurities may be implanted into the channel contact region 151 by an ion implantation process. For example, the p-type impurities may be aluminum (Al), boron (B), indium (In), or potassium (K). A concentration of the p-type impurities may be about 5E16 to 1E19 atoms/$cm^3$. In some other embodiments, the p-type impurities may be in-situ doped while growing the channel contact region 151 by SEG.

Subsequently, after the cell columns PL and the isolation regions 121 are formed as illustrated in FIGS. 10D to 10F, the sacrificial layers 123 may be removed as illustrated in FIG. 10G, and an auxiliary gate insulating layer 153 may be formed on a sidewall of the channel contact region 151 by a thermal oxidation process. The auxiliary gate insulating layer 153 may be a thermal oxidation layer formed by thermal oxidation of part of the channel contact region 151 grown by SEG. In some embodiments, the thermal oxidation process for forming the auxiliary gate insulating layer 153 may be omitted.

Subsequently, after the blocking dielectric layer 134, the tunnel insulating layer 132, the charge storage layer 133, and the conductive layer 140 are formed as illustrated in FIGS. 10H and 10I, an isolation insulating layer 120 that fills each of the isolation regions 121 may be formed.

Figure 15A:
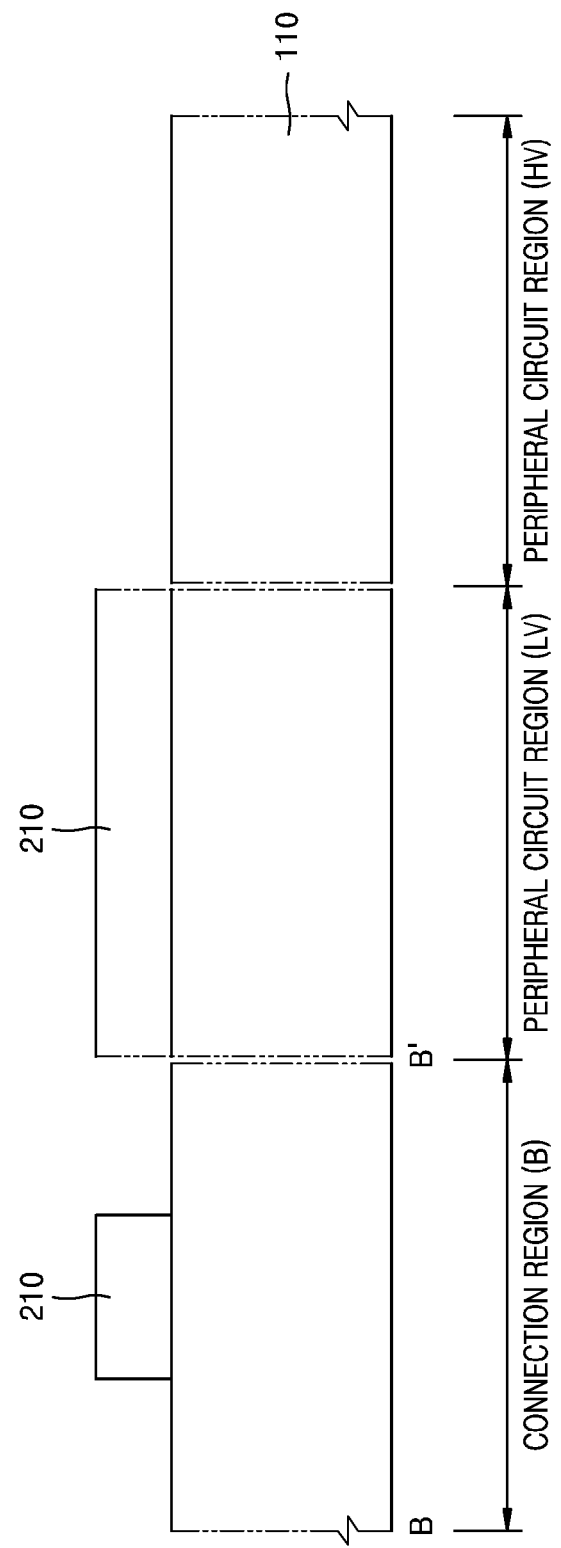
FIGS. 15A and 15B are side cross-sectional views illustrating a sequential process of forming a local planarized region including a protruding portion of a substrate, according to an example embodiment.
Figure 15B:
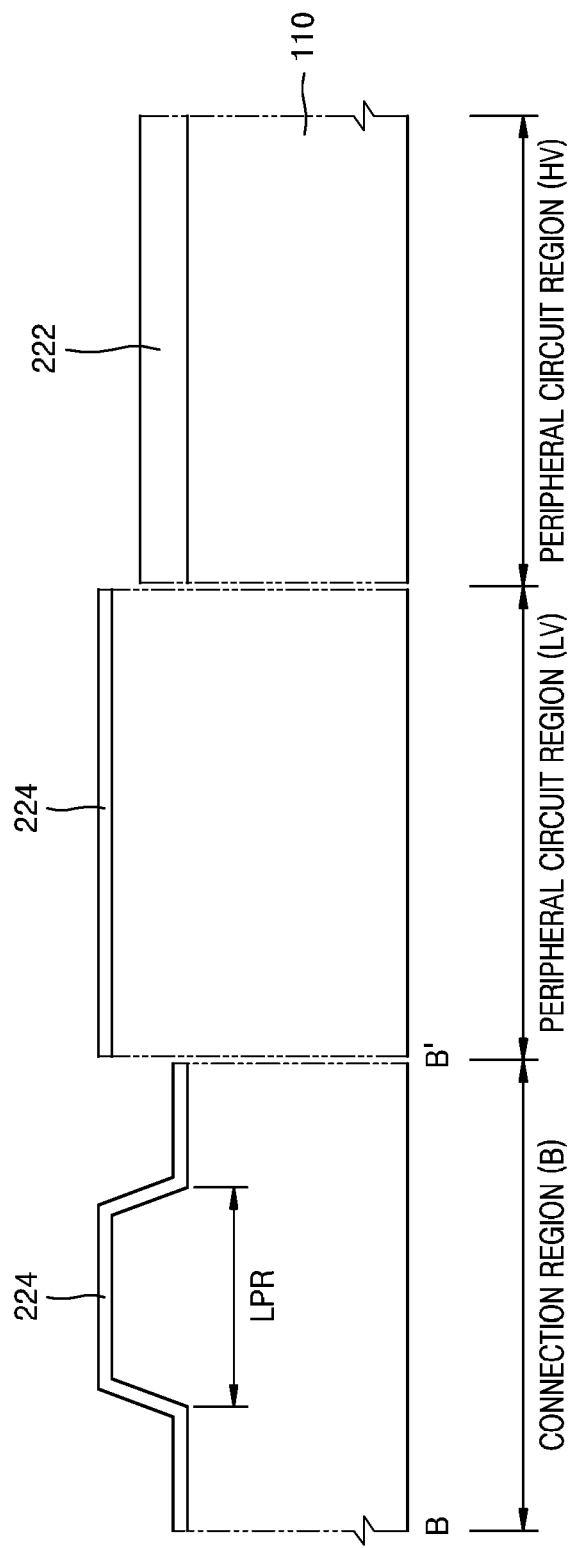

FIGS. 15A and 15B are side cross-sectional views illustrating a sequential process of forming the local planarized region LPR that includes protruding portion of the substrate 110, according to an example embodiment.

Referring to FIG. 15A, a substrate 110 may include a connection region B and a peripheral circuit region HV and LV. In particular, the peripheral circuit region HV and LV may include a peripheral circuit region HV in which high-voltage electric devices (e.g., a high-voltage transistor) are to be formed and peripheral circuit region LV in which low-voltage electronic devices (e.g., a low-voltage transistor) are to be formed.

The peripheral circuit region HV may need a gate insulating layer having a relative large thickness since a high voltage is used to drive electric devices in the peripheral circuit region HV. The peripheral circuit region LV may need a gate insulating layer having a relatively small thickness since a low voltage is used to drive electric devices in the peripheral circuit region LV. To satisfy these needs, an upper surface of the peripheral circuit region HV may be at a lower level than an upper surface of the peripheral circuit region LV.

To lower the level of the upper surface of the peripheral circuit region HV, an etch mask 210 may be formed to cover the peripheral circuit region LV. The etch mask 210 may also cover the local planarized region LPR in the connection region B.

Referring to FIG. 15B, the level of the upper surface of the peripheral circuit region HV may be lowered by anisotropic etching. During this anisotropic etching, the other region of the connection region B except for the local planarized region LPR may also be anisotropically etched, so that the local planarized region LPR may be formed to have a higher level than the other region of the connection region B.

Since the exposed region of the connection region B except for the local planarized region LPR and the peripheral circuit region HV are simultaneously etched, a protrusion height of the local planarized region LPR in the connection region B may be substantially the same as a difference in level between the upper surface of the peripheral circuit region HV and the upper surface of the peripheral circuit region LV.

According to the embodiment illustrated in FIGS. 15A and 15B, at least part of the empty space in the local planarized region LPR may be filled without an additional process, so that the manufacturing cost of a semiconductor memory device may be reduced.

Subsequently, a thick gate insulating layer 222 may be formed on the peripheral circuit region HV, whereas a thin gate insulating layer 224 may be formed on the peripheral circuit region LV and the connection region B.

In some embodiments, the thin gate insulating layer 224 may also serve as a buffer dielectric film 122 (see FIG. 3) in the connection region B and the cell array region (not shown in FIG. 15B).

After the local planarized region LPR is formed to include the protruding portion of the substrate 110 as illustrated in FIG. 15B, the same processes as described above with reference to FIGS. 10B to 10I and FIGS. 11 to 14 may be performed. A detailed description of the processes is not omitted here.

Figure 16:
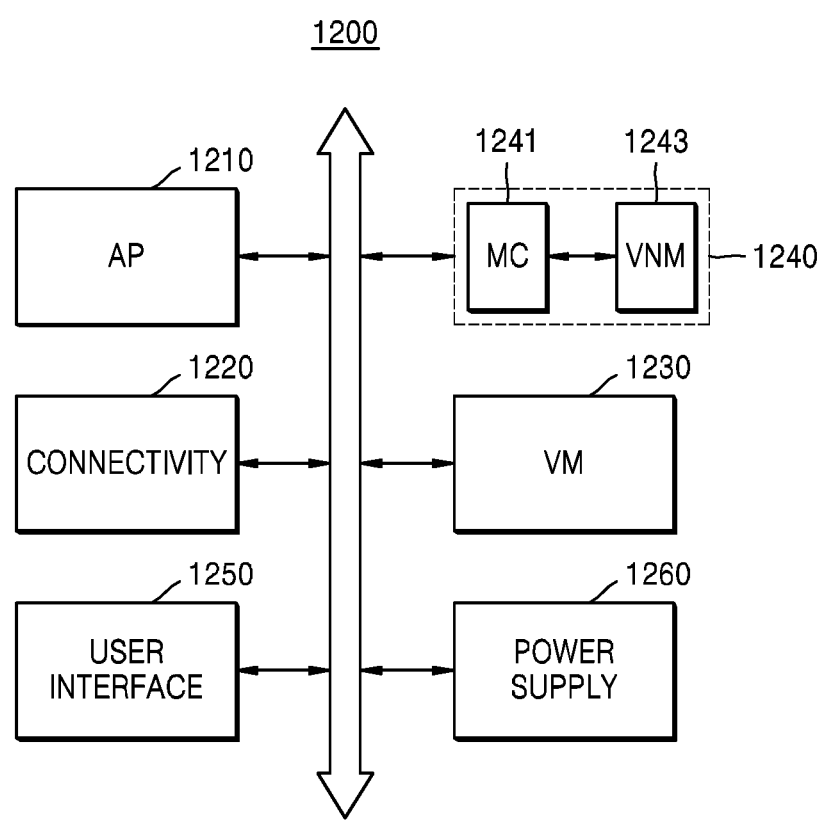
FIG. 16 is a block diagram of an example mobile system to which an integrated circuit (IC) device according to an example embodiment is applied.

FIG. 16 is a block diagram of a mobile system 1200 to which an integrated circuit (IC) device according to an example embodiment is applied.

Referring to FIG. 16, the mobile system 1200 may include an application processor 1210, a connectivity unit 1220, a volatile memory device 1230, a nonvolatile memory system 1240, a user interface 1250, and a power supply 1260.

The mobile system 1200 may be any mobile system, such as a mobile phone, a smart phone, a personal digital assistant (PDA), a portable multimedia player (PMP), a digital camera, a music player, a portable game console, or a navigation system.

The application processor 1210 may perform applications providing internet browsers, games, or videos. In some example embodiments, the application processor 1210 may include a single core or a multi-core. For example, the application processor 1210 may include a multi-core, such as a dual-core, a quad-core, or a hexa-core. Also, the application processor 1210 may further include a cache memory located in the inside or outside thereof.

The connectivity unit 1220 may communicate with an external device by wire or wireless. For example, the connectivity unit 1220 may perform Ethernet communication, near field communication (NFC), radio frequency identification (RFID) communication, mobile telecommunication, memory card communication, or universal serial bus (USB) communication. For example, the connectivity unit 1220 may include a baseband chipset and may support communication such as GSM, GPRS, WCDMA, HSxPA, and the like The volatile memory device 1230 may store data that is processed by the application processor 1210 or may operate as a working memory. For example, the volatile memory device 1230 may be implemented with dynamic random access memory (DRAM), static random access memory (SRAM), mobile DRAM, double data rate (DDR) synchronous DRAM (DDR SDRAM), low power DDR (LPDDR) SDRAM, graphic DDR (GDDR) SDRAM, Rambus DRAM (RDRAM), or a memory that is similar thereto.

The nonvolatile memory system 1240 may include a memory controller 1241 and a nonvolatile memory device 1243 and store a boot image for booting the mobile system 1200. For example, the nonvolatile memory device 1143 may be implemented with electrically erasable programmable read-only memory (EEPROM), a flash memory, phase change random access memory (PRAM), resistance random access memory (RRAM), nano floating gate memory (NFGM), polymer random access memory (PoRAM), magnetic random access memory (MRAM), ferroelectric random access memory (FRAM), or a memory that is similar thereto. The nonvolatile memory device 1243 may include any one of the semiconductor memory devices described above reference to FIGS. 4A to 9.

The user interface 1250 may include one or more input devices, such as a keypad or a touch screen, and/or one or more output devices, such as a speaker or a display device.

The power supply may supply an operating voltage of the mobile system 1200. The mobile system 1200 may further include a camera image processor (CIS) and a storage device, such as a memory card, a solid state drive (SSD), a hard disk drive (HDD), or a CD-ROM.

The mobile system 1200 may be mounted by using packages of various types. For example, the mobile system 1200 may be mounted by using packages, such as package on package (PoP), ball grid array (BGA), chip scale package (CSP), plastic leaded chip carrier (PLCC), plastic dual in-line package (PDIP), die in waffle pack (DWP), die in wafer form (DWF), chip on board (COB), ceramic dual in-line package (CERDIP), plastic metric quad flat pack (MQFP), thin quad flat-pack (TQFP), small outline IC (SOIC), shrink small outline package (SSOP), thin small outline package (TSOP), thin quad flat-pack (TQFP), system in package (SIP), multi chip package (MCP), wafer-level fabricated package (WFP), and wafer-level processed stack package (WSP).

While the inventive concepts have been particularly shown and described with reference to embodiments thereof, it will be understood that various changes in form and details may be made therein without departing from the spirit and scope of the following claims.

What is claimed is:

1. A semiconductor memory device comprising:
    a substrate including a cell region and a connection region;
    a first word line stack including a plurality of insulating patterns and a plurality of first word lines that extend to the connection region and are alternately stacked on the cell region;
    a second word line stack including a plurality of insulating patterns and a plurality of second word lines that extend to the connection region and are alternately stacked on the cell region, the second word line stack being adjacent to the first word line stack;
    vertical channels in the cell region of the substrate, the vertical channels being connected to the substrate and coupled with the plurality of first and second word lines;
    a bit line connecting the vertical channels;
    a bridge region that connects the first word lines of the first word line stack with the corresponding second word lines of the second word line stack at the same level as the first word lines and the second word lines; and
    a local planarized region under the bridge region, the local planarized region being spaced apart from the vertical channels.

2. The semiconductor memory device of claim 1, further comprising:
    a first ground selection line under the first word lines; and
    a second ground selection line under the second word lines,
    wherein the first ground selection line and the second ground selection line are isolated from one another by the local planarized region.

3. The semiconductor memory device of claim 2, wherein the substrate has a protruding portion in the local planarized region, the protruding portion being at a higher level than an upper surface of the substrate under the first word line stack.

4. The semiconductor memory device of claim 3, wherein the protruding portion of the substrate in the local planarized region is higher by about 20 Å to about 300 Å with respect to the upper surface of the substrate under the second word line stack.

5. The semiconductor memory device of claim 3, wherein the substrate further includes,
    a low-voltage peripheral circuit region having a low-voltage transistor, and
    a high-voltage peripheral circuit region having a high-voltage transistor,
    wherein the protruding portion of the substrate in the local planarized region has a height that is substantially the same as a difference in height between the low-voltage peripheral circuit region and the high-voltage peripheral circuit region of the substrate.

6. The semiconductor memory device of claim 2, wherein the local planarized region includes an oxide layer formed by oxidizing a part of the substrate.

7. The semiconductor memory device of claim 6, wherein the oxide layer of the substrate has a shape with a thickness that gradually reduces towards edge regions of the local planarized region.

8. The semiconductor memory device of claim 6, wherein the oxide layer of the substrate has an edge region with a bird's beak-like cross-sectional shape.

9. The semiconductor memory device of claim 6, wherein upper surfaces of the first ground selection line or the second ground selection line near the local planarized region gradually rises towards the local planarized region.

10. The semiconductor memory device of claim 2, wherein the first ground selection line or the second ground selection line has a recess in a lateral direction on a side thereof near the local planarized region.

11. The semiconductor memory device of claim 2, wherein the first ground selection line or the second ground selection line has a protruding portion in a lateral direction on a side thereof near the local planarized region.

12. A semiconductor device comprising:
a first horizontal electrode that extends on a semiconductor substrate in a first direction, the first direction being parallel to an upper surface of the semiconductor substrate;
a second horizontal electrode that extends on the same level as the first horizontal electrode in the first direction;
vertical channels being connected to the semiconductor substrate and coupled with the first and second horizontal electrodes;
a filler that at least partially fills a local planarized region between the first horizontal electrode and the second horizontal electrode, the filler being at the same level as the first horizontal electrode and the second horizontal electrode; and
a bridge region including a stack of conductors and insulators in which the conductors and the insulators are alternately stacked, the bridge region being on the filler,
wherein the local planarized region is spaced apart from the vertical channels.

13. The semiconductor device of claim 12, wherein the filler is a silicon oxide or a protruding portion of the semiconductor substrate.

14. The semiconductor device of claim 13, wherein the filler is a silicon oxide, the filler has a height (A) from a planar upper surface of the substrate in a vertical direction, and a depth (B) from the planar upper surface in the vertical direction, and a ratio of the height to the depth (A:B) is from about 50:50 to about 60:40.

15. The semiconductor device of claim 13, wherein the filler is the protruding portion of the semiconductor substrate, and the filler has a slanted side.

16. A semiconductor device including;
a substrate;
a first conformal CVD stack on the substrate in a first region, the first stack including a plurality of first layers, the plurality of first layers including a plurality of first conduction layers and a plurality of first insulating layers;
a first vertical channels being connected to the substrate and passing through the first conformal CVD stack;
a second conformal CVD stack on the substrate in a second region, the second stack including a plurality of second layers, the plurality of second layers including a plurality of second conduction layers and a plurality of second insulating layers;
a second vertical channels being connected to the substrate and passing through the second conformal CVD stack;
a bit line connecting the first vertical channel and the second vertical channel;
a bridge region connecting each one of the first layer to the corresponding one of the second layer at the same level as the one of the first layer and the one of the second layer; and
a local planarized layer under the bridge region, the local planarized layer spaced apart from the first vertical channels.

17. The semiconductor device of claim 16, wherein the first conduction layers and the second conduction layers include silicon, and
the first conduction layers and the second conduction layers are substantially the same.

18. The semiconductor device of claim 16, wherein the first insulating layers and the second insulating layers include oxide, and
the first insulating layers and the second insulating layers are substantially the same.

19. The semiconductor device of claim 16, wherein the first conformal CVD stack and the second conformal CVD have substantially the same dimensions, and the bridge has substantially smaller dimensions than the first conformal CVD stack and the second conformal CVD stack.

* * * * *